(12) United States Patent
Murayama et al.

(10) Patent No.: US 6,684,365 B1
(45) Date of Patent: Jan. 27, 2004

(54) ENCODING DEVICE AND METHOD, DECODING DEVICE AND METHOD, PROVIDING MEDIUM, AND METHOD FOR GENERATING DATA SUBSTITUTION POSITION INFORMATION

(75) Inventors: Jun Murayama, Tokyo (JP); Takashi Yokokawa, Tokyo (JP); Masayuki Hattori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/393,074

(22) Filed: Sep. 7, 1999

(30) Foreign Application Priority Data

Sep. 8, 1998 (JP) .......................................... 10-253584
May 13, 1999 (JP) .......................................... 11-132341

(51) Int. Cl.$^7$ ............................................. H03M 13/03
(52) U.S. Cl. ........................................ 714/787; 714/786
(58) Field of Search ................................ 714/787, 785, 714/755, 756, 786, 746, 762, 701, 791

(56) References Cited

U.S. PATENT DOCUMENTS 4,291,406 A * 9/1981 Bahl et al. .................. 714/791

| | | | |
|---|---|---|---|
| 6,055,277 A | * | 4/2000 | Stephens et al. ............ 375/285 |
| 6,081,921 A | * | 6/2000 | Simanapalli |
| 6,192,500 B1 | * | 2/2001 | Yang et al. |
| 6,233,711 B1 | * | 5/2001 | Murayama et al. |

OTHER PUBLICATIONS

L.C. Perez et al.: "A distance spectrum, interpretation of turbo codes" IEEE Transactions on Information Theory, vol. 42, No. 6, Nov. 1996, pp. 1698–1709, XP002165797.

* cited by examiner

Primary Examiner—Phung M. Chung
(74) Attorney, Agent, or Firm—Frommer Lawrence & Haug LLP; William S. Frommer

(57) ABSTRACT

Encoded data having a small code word weighting are not output. In a step S21, a sequence p[i] (0≦i<N) is set so that there is no duplication in the values from 0 to (N−1), in a step S22, all positions for which specific substitution patterns are generated in the sequence p[i] are examined, the information is stored in the sequence r[i], and the sum of this information is set as TOTAL. The routine proceeds to a step S24, positions which do not generate specific substitution patterns, i.e., predetermined values j not contained in r[i] (0≦j<N), are randomly selected, and processing which replaces p[r[i]] by p[j] for all r[i] is performed.

32 Claims, 25 Drawing Sheets

EXAMPLE OF SUBSTITUTION PATTERN DETECTED ACCORDING TO CONDITIONS 1 AND 2

EXAMPLE OF SUBSTITUTION PATTERN DETECTED ACCORDING TO CONDITIONS 3 AND 4

EXAMPLE OF SUBSTITUTION PATTERN DETECTED ACCORDING TO CONDITIONS 5 AND 6

EXAMPLE OF SUBSTITUTION PATTERN DETECTED ACCORDING TO CONDITIONS 7 AND 8

| INPUT DATA POSITION | 0 | 1 | 2 | 3 | 4 |
|---|---|---|---|---|---|
| OUTPUT DATA POSITION | 4 | 2 | 0 | 3 | 1 |

FIG. 23A

```
ENCODED      TERMINATION
DATA         BIT
...000000001000  11
        ↙
...001000000000  10
```

| EXAMPLE OF SUBSTITUTION PATTERN DETECTED ACCORDING TO CONDITIONS 2-1 AND 2-2 |
|---|

FIG. 23B

```
ENCODED      TERMINATION
DATA         BIT
...010000001000  10
        ↙   ↘
...001000000100  01
```

| EXAMPLE OF SUBSTITUTION PATTERN DETECTED ACCORDING TO CONDITIONS 2-3 |
|---|

FIG. 23C

```
ENCODED         TERMINATION       ENCODED          TERMINATION
DATA            BIT               DATA             BIT
...00100000000010  01             ...000100000010...   00
     ↙      ↘                              ↙    ↘
...000100000100... 00             ...010000000001000   10
```

| EXAMPLE OF SUBSTITUTION PATTERN DETECTED ACCORDING TO CONDITIONS 2-4 AND 2-5 |
|---|

ENCODING DEVICE AND METHOD, DECODING DEVICE AND METHOD, PROVIDING MEDIUM, AND METHOD FOR GENERATING DATA SUBSTITUTION POSITION INFORMATION

BACKGROUND OF THE INVENTION

1. Field of the Invention

This invention relates to an encoding device and method, a decoding device and method, and providing medium, and in particular, to an encoding device and method, a decoding device and method, and a providing medium which can conveniently be applied when performing turbo encoding or decoding.

2. Description of the Related Art

One type of code having a performance near the Shannon limit which is the theoretical limit of coding performance is a turbo code. This turbo code encodes by a structure which combines plural convolution encoding circuits and interleavers (interleaving circuits), and on the decoding side, information about input data is exchanged between decoding circuits which output plural soft outputs so as to obtain a final decoding result.

FIG. 9 shows the structure of a conventional turbo encoding device 10. This turbo encoding device 10 comprises a convolution encoding circuit 1-1 which performs convolution encoding on input data to obtain encoded data, interleavers 2-1 to 2-(N−1) which perform sequential interleaving on this input data (hereafter, these will be referred to simply as the interleavers 2 when it is unnecessary to distinguish the interleavers 2-1 to 2-(N−1) separately, the same practice being adopted for other devices), and convolution encoding circuits 1-2 to 1-N which perform convolution encoding on the outputs of these interleavers 2 to obtain encoded data.

Herein, the convolution encoding circuit 1 performs a convolution computation on the input data, and the computation results are output as encoded data.

One advantage of convolution encoding is that soft determination decoding can be performed more simply than block decoding. The interleavers 2 involute the sequence of input data to generate an output. By rearranging a pattern which gives a low output weighting with one convolution code, the interleavers 2 can increase output with other convolution codes, and can construct a high performance code by increasing the minimum distance of code words.

FIG. 10 shows one example of the convolution encoding circuit 1. The convolution encoding circuit 1 shown in FIG. 10 is a feedback type convolution encoding circuit having a restriction length 3.

This convolution encoding circuit comprises a termination circuit 21, three exclusive "or" circuits (hereafter, "EXOR circuits") 22-1 to 22-3, and two shift registers 23-1 and 23-2, and generates encoded data from input data.

Herein, the shift registers 23 function as a delay element which delays input data by one unit time, and the EXOR circuit 22 outputs the exclusive or of the input data. Input data is output until the termination circuit 21 has finished encoding all the input data, and feedback data is output for two unit times (times corresponding to the number of shift registers) from when encoding has finished. The processing subsequent to encoding of all input data is intended to restore all the contents of the shift registers to 0, which is referred to as "termination", and decoding is performed on the decoding side assuming this processing has been performed.

The state transition diagram of the convolution encoding circuit 1 shown in FIG. 10 is as shown in FIG. 18. As shown in this diagram, the convolution encoding circuit 1 has an initial state $S_0$, and three other states $S_1$, $S_2$ and $S_3$. As shown in the diagram, when a "0" bit is input in the state $S_0$, the state returns to the current state $S_0$, and the value "0" is output, whereas when a "1" is input, a transition to the state $S_1$ occurs and the value "1" is output. When a "0" bit is input in the state $S_2$, a transition to the state $S_3$ occurs and "1" is output, whereas when a "1" is input, a transition to the state $S_2$ occurs and the value "0" is output. When a "0" bit is input in the state $S_2$, a transition to the state $S_1$ occurs and the value "0" is output, whereas when a "1" is input, a transition to the state $S_0$ occurs and the value "1" is output. When a "0" bit is input in the state $S_3$, a transition to the state $S_2$ occurs and the value "1" is output, whereas when a "1" is input, a transition to the state $S_3$ occurs and the value "0" is output.

The output of the convolution encoding circuit 1 relative to input data can be easily understood by referring to this state transition diagram.

In the convolution encoding circuit 1 shown in FIG. 18, if zero is input three times in succession, the state returns to the original state prior to input of zero. This is true even in any of the states $S_1$, $S_2$, $S_3$ which are different from the initial state $S_0$ (for example, if zero is input three times in succession in the state $S_1$, the transition $S_1 \rightarrow S_2 \rightarrow S_3 \rightarrow S_1$ occurs and the state returns to the state $S_1$). Therefore, the period p of this convolution encoding circuit 1 is 3.

FIG. 11 shows an example of the interleavers 2. Input data input to the interleavers 2 is first stored in an input data storage memory 31, and its sequence is then rearranged by a data substitution circuit 32. The rearrangement of the data sequence is performed based on the contents (substitution position information) of a substitution data ROM (Read Only Memory) 34. The data with a rearranged sequence are stored in an output storage memory 33, and then output as output data.

FIG. 11 shows a typical case of operation wherein the size of the interleavers 2 is 5, and the contents of the substitution data ROM 34 are as shown in FIG. 12. Specifically, when the input data are "11010", "00111" is output as output data due to the data substitution circuit 32 performing substitution processing on the input data according to the data stored in the substitution data ROM 34.

The operation of the turbo encoding device 10 shown in FIG. 9 will now be described. Input data is supplied to the convolution encoding circuit 1-1. In this convolution encoding circuit 1-1, a convolution computation is performed on the input data, termination is performed, and encoded data is output by an encoding which comprises termination.

The input data is also supplied to the series of interleavers 2-1 to 2-(N−1), and after the sequence of the sequentially input data is involuted, the data is output. The data output by these interleavers 2-1 to 2-(N−1) is supplied to corresponding convolution encoding circuits 1-2 to 1-N. In these convolution encoding circuits 1-2 to 1-N, a convolution computation is performed on the output data from the corresponding interleavers 2-1 to 2-(N−1), termination is performed, and encoded data is output by an encoding which comprises termination.

FIG. 13 shows the relation of the data input to the turbo encoding device 10, and the number of bits of encoded data. k bits of input data are converted to an $n_1$ bit code by the convolution encoding circuit 1-1 and a $t_1$ bit termination is added, so the result is a $(n_1+t_1)$ bit code. Similarly, $(n_2+t_2)$ to $(n_N+t_N)$ bits of coded data are output from the convolution encoding circuits 1-2 to 1-N.

FIG. 14 shows the construction of a prior art turbo decoding device 40. This turbo decoding device 40 comprises plural soft output decoding circuits 51-1 to 51-N corresponding to the number of encoded data (received data) output by the turbo encoding device 10. The soft output decoding circuits 51-1 to 51-N use a "soft output decoding scheme" having the function of a MAP (Maximum A Posteriori Probability) decoder or SOVA (Soft Output Viterbi Algorithm) decoder which compute the probability of the input data being 0 or 1 on the encoding side. Soft output is a scheme wherein reliability information about a decoding result is attached to the decoding result.

The operation of the turbo decoding device 40 shown in FIG. 14 will now be described. The received data (encoded data) is supplied to the soft output decoding circuits 51-1 to 51-N. In the decoding circuits 51-1 to 51-N, repetitive decoding operations are respectively performed several times and several tens of times, making common use of estimated probability value data, on the input data excluding the termination bit on the encoding side. The final decoded data is output from any of the decoding circuits (the decoding circuit 51-1 in FIG. 51-1).

FIG. 15 shows the relation between the data received from the turbo decoding device 40, estimated probability value data and number of bits of decoded data, and it corresponds to the relation between numbers of bits in the turbo encoding device 10 of FIG. 9. The soft output decoding circuits 51-1 to 51-N respectively compute k-bits of estimated probability value data of the input data excluding the termination bit from the $(n_1+t_1)$th to the $(n_N+t_N)$ th of received data. This k bits of probability value data is exchanged between decoding circuits, and k bits of decoded data are finally output.

FIG. 16 is a diagram which describes the encoded data output when a specific numeric value is input into the turbo encoding device 10. In the turbo encoding device 10 shown in FIG. 16, the input data are output as encoded data without transiting the convolution encoding circuit 1-1, and is also input to the convolution encoding circuit 1-2 and interleaver 2-1. The data input to the interleaver 2-1 are mixed up, and are output to the convolution encoding circuit 2-3.

The case will be described where, for example, "0010010 . . . 0" are input as input data. The relation of input data positions and substitution data positions stored in the substitution data ROM 34 of the interleaver 2-1 is shown below.

so when the second "1" is input to the convolution encoder 1-2 and convolution encoder 1-3, the entire contents of the shift registers contained therein are set to 0. Therefore, after the second "1" is input, 0 is output continuously. The setting of the contents of the shift registers to 0 depends on the fact that the distance between the first and second "1" (=3) is equal to the period p(=3, FIG. 18) of the convolution encoding circuit 1.

The interleaver 2-1 may be what is known as an "affine interleaver". This is an interleaver which interleaves an ith position input signal in a position axi+b modN using the interleaver size N, a coprimal, predetermined constant a and an arbitrary constant b, according to the position i of the input signal.

Wen N=2 m~2 and a=2 m+−1, the affine interleaver necessarily sets the sum of the distances between two arbitrary points before and after substitution as 2 m or greater. If an affine interleaver is used as the interleaver 2-1 of the turbo encoding device 10 shown in FIG. 17, and these parameters are N=32, a=7, b=0, the substitution data positions shown below are stored as the contents of the substitution data ROM 34 of the interleaver 2-1 .

TABLE 1

| Input data position | | | | | | | | | | | | | | | | | | | | |
|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 |
| Substitution data position | 29 | 27 | 5 | 28 | 30 | 2 | 17 | 10 | 12 | 7 | 20 | 31 | 18 | 11 | 14 | 22 | 1 | 8 | 25 | 26 |

| | Input data position | | | | | | | | | | | |
|---|---|---|---|---|---|---|---|---|---|---|---|---|
| | 20 | 21 | 22 | 23 | 24 | 25 | 26 | 27 | 28 | 29 | 30 | 31 |
| Substitution data position | 4 | 24 | 15 | 21 | 19 | 3 | 6 | 0 | 9 | 13 | 16 | 23 |

Herein, when the data "0010010 . . . 0" are input as shown in FIG. 16, even if the pattern "1001" of this data is mixed up by the interleaver 2-1, it is again substituted by "1001",

TABLE 2

| Input data position | | | | | | | | | | | | | | | | | | | | |
|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 |
| Substitution data position | 0 | 7 | 14 | 21 | 28 | 3 | 10 | 17 | 24 | 31 | 6 | 13 | 20 | 27 | 2 | 9 | 16 | 23 | 30 | 5 |

| | Input data position | | | | | | | | | | | |
|---|---|---|---|---|---|---|---|---|---|---|---|---|
| | 20 | 21 | 22 | 23 | 24 | 25 | 26 | 27 | 28 | 29 | 30 | 31 |
| Substitution data position | 12 | 19 | 26 | 1 | 8 | 15 | 22 | 29 | 4 | 11 | 18 | 25 |

The interleaver 2-1 which stores the above-mentioned substitution data positions as the contents of the substitution data ROM 34 ensures that the sum of the distances between two arbitrary points before and after substitution is 8 or greater. This property prevents replacing "1001" (the distance between "1" and "1" is the same 3 as the period of the convolution encoding circuit 1) by "1001" (the distance between "1" and "1" is the same 3 as the period of the convolution encoding circuit 1). However, when two "1001" are input as shown in FIG. 17, it is again substituted by the pattern "1001", and a code with a small weighting of 20 is output as a result.

SUMMARY OF THE INVENTION

However, in order to obtain a high error correction performance in a turbo encoding device or a turbo decoding device, the minimum distance of the code must be increased, and an interleaver must be constructed to perform substitutions wherein the number of "1"s which are output (output code word weighting) is increased whatever the input may be.

However, in the interleaver 2-1 mentioned above, as only some of the patterns giving a small output code word weighting are removed, a turbo encoding device or turbo decoding device providing the desired high error correction performance could not be constructed.

This invention, which was conceived in view of the above problems, therefore aims to perform interleaving by removing patterns giving a small output code word weighting.

An interleaving means defined in claim 1 interleaves input data using an interleaving pattern from which predetermined patterns have been removed.

Specifically, removed patterns means patterns giving a small output code word weighting. For example, a pattern satisfying at least one of the first to eighth sets of relations of claim 3 to claim 10 is an interleaving pattern which makes the weighting of output code words small. By removing these patterns, a turbo encoding device and turbo decoding device which offer higher error correction performance can be constructed.

In an encoding device defined in claim 11, an interleaving means increases minimum values of code words as much as possible by removing patterns giving a small output code word weighting due to the effect of the termination bit added to the end of the interleave. Moreover, the encoding devices defined in claims 12 to 26 suppress occurrence of specific substitution patterns in the vicinity of the end of an interleaving pattern, and more specifically apply a ninth to twenty-third set of relations for detecting such substitution patterns. As a result, patterns giving a small output code word weighting due to the effect of the termination bit added to the end of the encoded data are removed, and error correction performance can be further improved.

In an encoding method defined in claim 29, an interleaving means interleaves input data using an interleaving pattern from which predetermined patterns giving a small output code word weighting are removed. The interleaving means may remove interleaving patterns for which at least one of the first to twenty-third sets of relations respectively defined in claims 3 to 10 and claims 12 to 26 holds.

A providing medium provides a program which a computer can read which causes an interleaving means to perform processing comprising a step which detects whether or not a predetermined pattern giving a small code word weighting is generated, and a re-interleaving step which re-interleaves the predetermined interleaving pattern detected by the detection step. The interleaving means may remove interleaving patterns for which at least one of the first to twenty-third sets of relations respectively defined in claims 3 to 10 and claims 12 to 26 holds.

A decoding device defined in claim 30 comprises an interleaving means which performs reverse processing to the interleave processing performed by the encoding device.

A decoding method defined in claim 31 comprises an interleaving step which performs reverse processing to the interleave processing performed by the encoding device.

A providing medium defined in claim 32 provides a program which a computer can read, which performs processing comprising a deinterleaving step which performs reverse processing to the interleave processing performed by the encoding device.

A method for generating data substitution position information comprises a first step which provisionally generates data substitution position information, a second step which determines whether or not the data substitution position information generated in the first step generates a predetermined interleaving pattern, and a third step which provisionally regenerates the substitution data position information in response to the determining result of the second step, the determination of the second step being performed according to whether at least one of the first to twenty-third sets of relations respectively defined in claims 3 to 10 and claims 12 to 26 holds. The first to eighth sets of relations hold for substitution patterns giving a small output code word weighting. The ninth to twenty-third sets of relations hold for patterns giving a small output code word weighting due to the effect of the termination bit added to the end of the encoded data.

A providing medium is a providing medium which physically provides a computer program which performs processing, on a computer system, to generate data substitution position information for performing interleaving which mixes up input data in turbo encoding. This computer program comprises a first step which provisionally generates data substitution position information, a second step which determines whether or not the data substitution position information generated in the first step generates a predetermined interleaving pattern, and a third step which provisionally regenerates the data substitution position information in response to the determining result of the second step, the determination of the second step being performed according to whether or not at least one of the first to twenty-third sets of relations respectively defined in claims 3 to 10 and claims 12 to 26 holds.

In the encoding device defined in claim 1, interleaving and encoding of input data are performed by removing substitution patterns giving a small output code word weighting, so a turbo encoding device and turbo decoding device which offer a higher error correction performance can be constructed.

In the encoding method defined in claim 29 and the providing medium, input data is interleaved using an interleaving pattern from which predetermined patterns giving a small code word weighting are removed.

In the decoding device defined in claim 30, the decoding method defined in claim 31 and the providing medium defined in claim 32, processing is performed which is the reverse of the interleave processing performed by the encoding device.

In the method for generating data substitution position information, and the providing medium, interleave patterns are generated wherein substitution patterns giving a small output code word weighting, and substitution patterns giving a small output code word weighting due to the effect of the termination bit added to the end of the encoded data, are removed.

That is, higher error correction performance is provided by a turbo encoding device and turbo decoding device by constructing a turbo encoding device which mixes up input data using an interleave pattern generated in this way.

Further objects, features and advantages of this invention will become apparent from the detailed description based on the following embodiments thereof and appended drawings.

BRIEF DESCRIPTION OF THE DRAWINGS

FIG. 23 is a diagram describing substitution patterns detected according to the third embodiment of this invention.

DETAILED DESCRIPTION OF THE INVENTION

Specific embodiments of the invention will now be described. To clarify the correspondence between the means of the invention as claimed in the claims and the following embodiments, the corresponding embodiment is added (as an example) in brackets after each means in the description of the features of the invention, but this should not be construed as being limited to each means. Further, identical symbols are assigned to parts corresponding to the prior art case.

Figure 3:
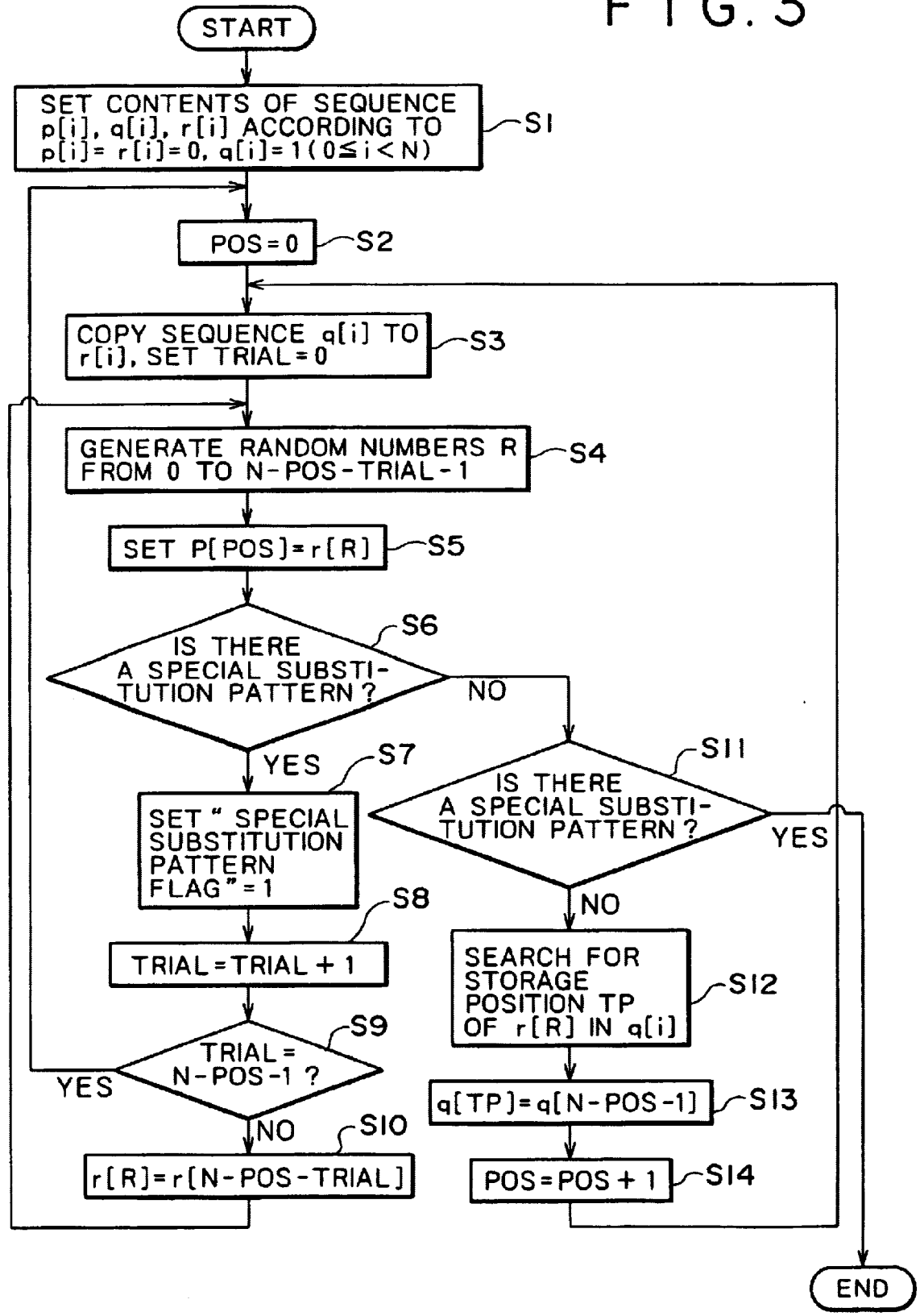
FIG. 3 is a flowchart which describes a processing procedure for determining data substitution position information.
Figure 4A:
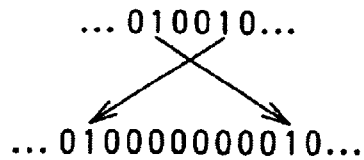
FIG. 4 is a diagram which describes substitution patterns detected according to the first embodiment of this invention.
Figure 4B:
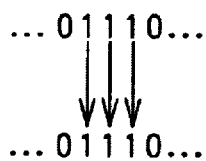
Figure 4C:
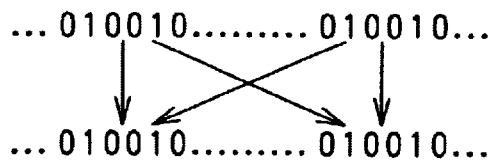
Figure 4D:
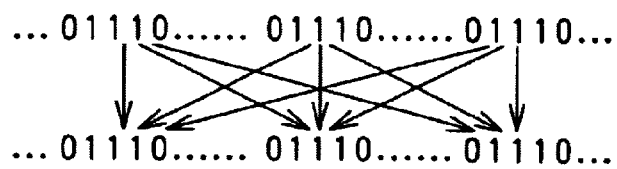

In the interleaving means of the encoding device as claimed in claim 1, to generate data substitution position information, i.e., an interleaving pattern, for mixing up input data, processing is performed wherein it is detected whether or not a predetermined interleaving pattern is generated (for example, step S5 of FIG. 3), and the detected predetermined interleaving pattern is re-interleaved (for example, step S2 to S10 of FIG. 3).

The decoding device defined in claim 33 comprises a deinterleaving means (for example, a soft output decoding circuit 111-1 of FIG. 8) which performs reverse processing to the interleave processing performed by the encoding device.

Figure 1:
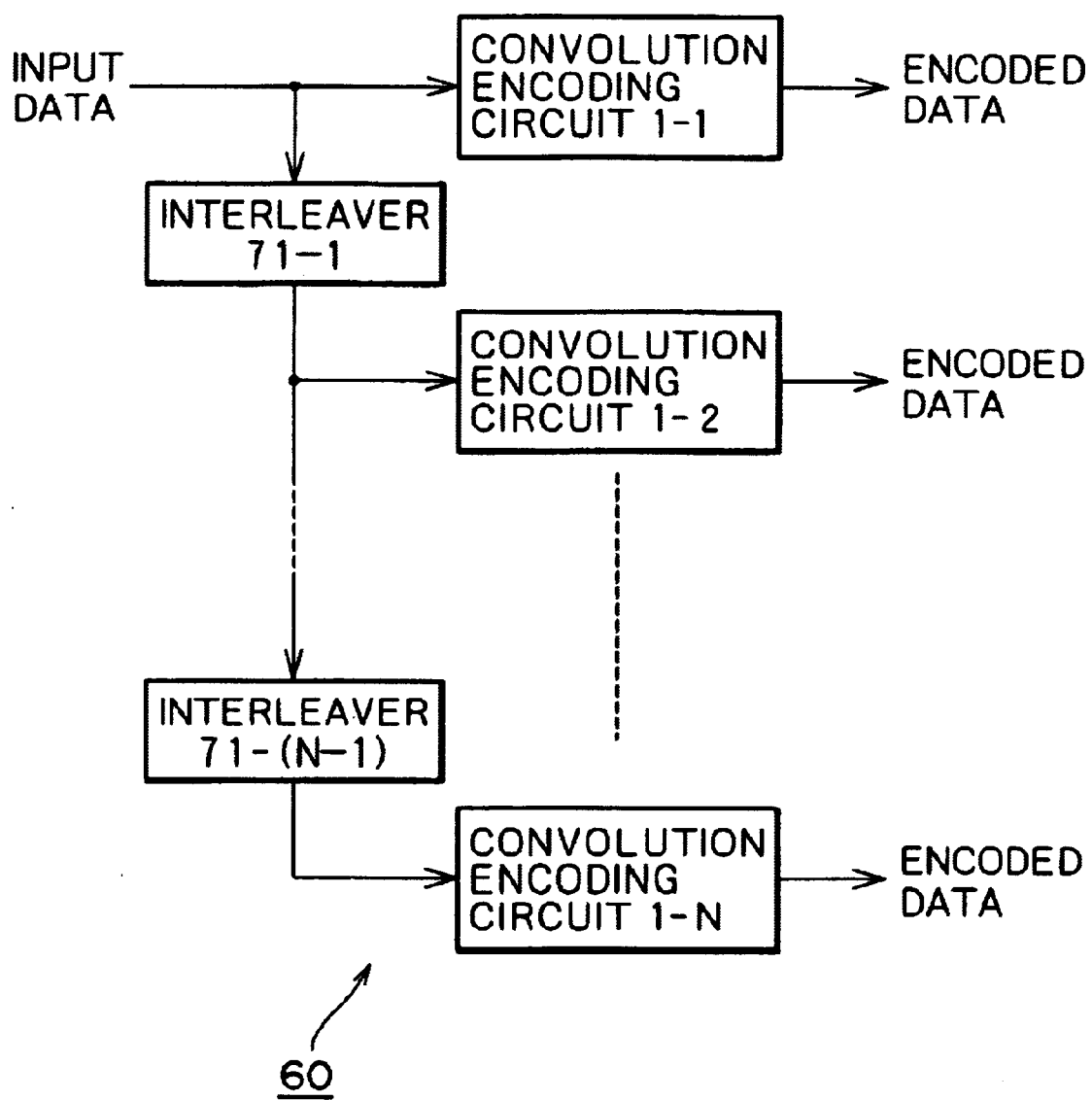
FIG. 1 is a block diagram showing the construction of a turbo encoding device 60 according to a first embodiment of this invention.

FIG. 1 shows the construction of a turbo encoding device 60 to which this invention is applied. This turbo encoding device 60 comprise a convolution encoding circuit 1-1 which performs convolution encoding on input data to obtain encoded data, interleavers 71-1 to 71-(N−1) which perform sequential interleaving on this input data, and convolution encoding circuits 1-2 to 1-N which perform convolution encoding on the output data from these interleavers 71-1 to 71-(N−1) to obtain encoded data.

Figure 10:
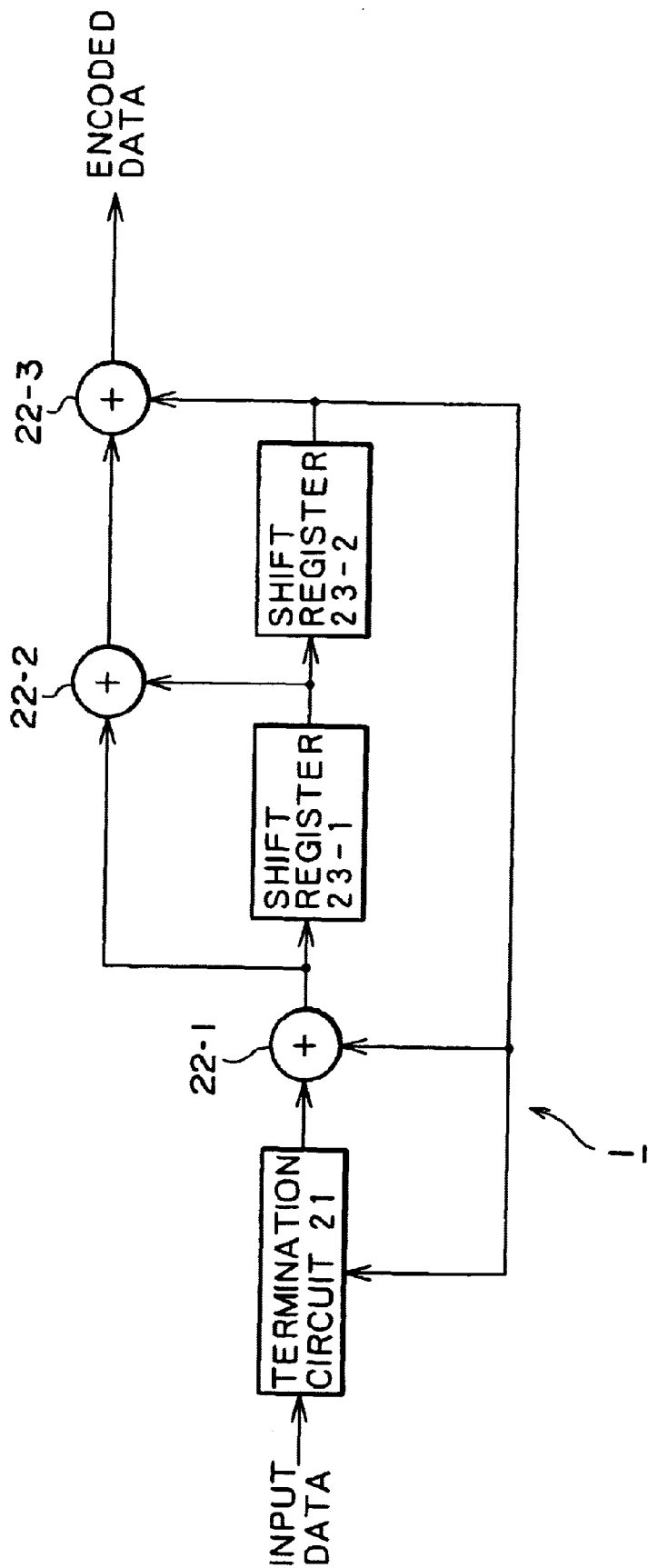
FIG. 10 is a block diagram showing the construction of a convolution encoding circuit 1.

Herein, the convolution encoding circuit 1 performs convolution computations on the input data, and respectively outputs the computation results as encoded data. It has the construction shown in FIG. 10, as in the aforementioned case. The interleavers 71 involute the sequence of the input data, and output the result.

Figure 2:
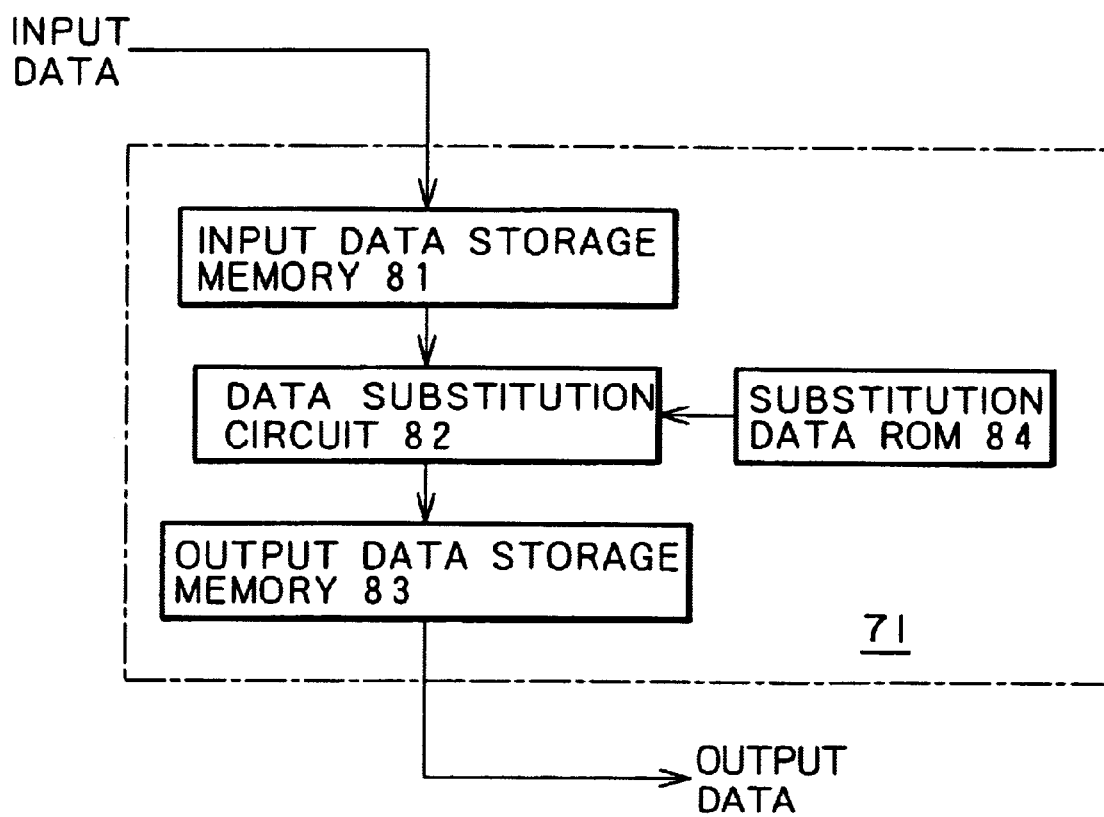
FIG. 2 is a block diagram showing the construction of an interleaver 71 used in the turbo encoding device 60.

FIG. 2 shows an example of the construction of the interleavers 71. Input data input to the interleavers 71 is first stored in an input data storage memory 81, and its sequence is then rearranged by a data substitution circuit 82. The rearrangement of the data sequence is performed based on the contents (substitution position information) of a substitution data ROM (Read Only Memory) 34. The data with a rearranged sequence are stored in an output data storage memory 83, and then output as output data.

Hereafter, the involution (substitution) of the input data sequence performed by the interleaver 71 shown in FIG. 2 will be described. This involution generates substitution position data so that specific substitution patterns are not produced. First, as a first embodiment, a method will be described for sequentially determining substitution positions while checking for specific substitution patterns, referring to the flowchart of FIG. 3. Due to the processing shown in this flowchart, the determined substitution position data are stored in the substitution data ROM 84.

In a step S1, a sequence p[i] which stores substitution position data, and sequences q[i] and sequences r[t] for storing substitution candidate positions, are initialized, and in a step S2, the value of a parameter POS is set to 0 which is an initial value. In a step S3, a value TRIAL is set to 0 which is an initial value, and the sequence g[i] is copied to the sequence r[i].

The 0th to (N−1)th data of q[i] contain substitution positions not yet stored in p[i], and r[i] contains remaining substitution position candidates in each stage of the trial performed to determine substitution positions for a predetermined POS. Hereafter, in a step S4, substitution positions stored in p[i] are sequentially determined starting from the 0th data.

In the step S4, random numbers R which take values from 0 to (N−POS−TRIAL−1) are generated, and in a step S5, p[POS]=r[R] is set. In a step S6, it is examined whether or not specific substitution patterns have been generated when substitution patterns from p[0] to p[POS] are considered. The detection of these specific substitution patterns is performed by determining whether or not, for example, one or more of the eight conditions shown below is satisfied.

(Condition 1)
When the period of the convolution code is p and the positions of two arbitrary points of an input signal from 0: to POS are $i_1, i_2 \{0, \ldots, POS\}$, $i_1 \neq i_2$, the following relations are satisfied for a predetermined value L1.

$$|i_1-i_2|=p \times l_1$$

$$|p[i_1]-p[i_2]|=p \times l_2$$

$$l_1 < L1, l_2 < L_1 \qquad \text{[Equations 1]}$$

Figure 18:
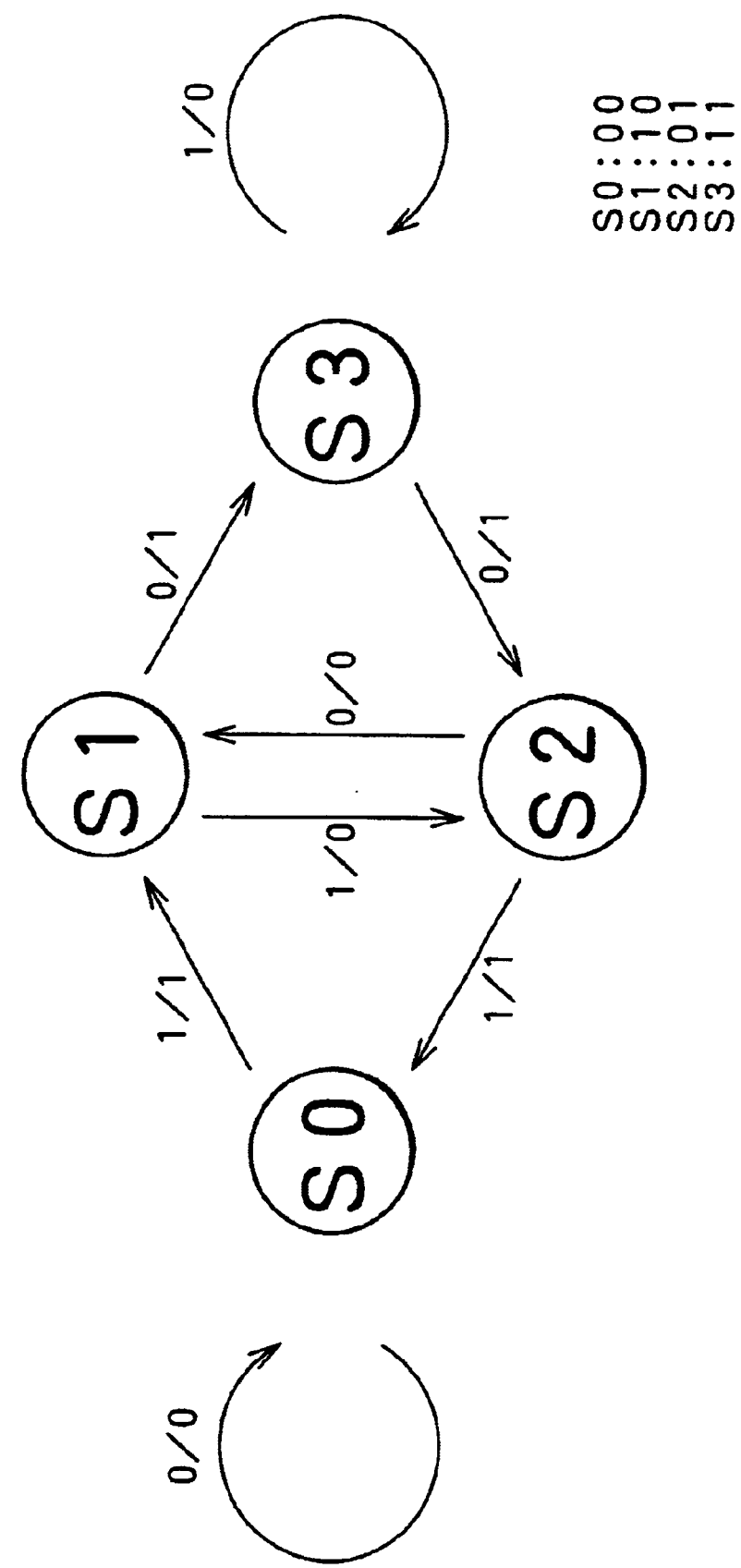
FIG. 18 is a state transition diagram of the convolution encoding circuit 1 shown in FIG. 10.

The period p of the convolution code given here is the number of times input of zero must be repeated in order to return a convolution encoding circuit which is not in its initial state, to its original state. That is, when zero is input p times for a convolution encoding circuit which is not in its initial state and which has a period p, it returns to its original state prior to input of zero (FIG. 18 and the above description).

(Condition 2)
When the period of the convolution code is p and the positions of two arbitrary points of an input signal from 0 to POS are $i_1, i_2 \{0, \ldots, POS\}$, $i_1 \neq i_2$, the following relations are satisfied for a predetermined value $L_2$.

$$|i_1-i_2|=p \times l_1$$

$$|p[i_1]-p[i_2]|=p \times l_2$$

$$l_1 + l_2 < L_2 \qquad \text{[Equations 2]}$$

(Condition 3)
When the positions of two arbitrary points of an input signal from 0 to POS are $i_1, i_2 \{0, \ldots, POS\}$, $i_1 \neq i_2$, the following relations are satisfied for a predetermined value S1.

$$|i_1-i_2| \leq S_1$$

$$|p[i_1]-p[i_2]| \leq S1 \qquad \text{[Equations 3]}$$

(Condition 4)
When the positions of two arbitrary points of an input signal from 0 to POS are $i_1, i_2 \{0, \ldots, POS\}$, $i_1 \neq i_2$ the following relation is satisfied for a predetermined value $S_2$.

$$|i_1-i_2|+|p[i_1]-p[i_2]| \leq S_2 \qquad \text{[Equation 4]}$$

(Condition 5)
When the period of the convolution code is p and the positions of four arbitrary points of an input signal from 0 to POS are $i_1, i_2, i_3, i_4 \{0, \ldots, POS\}$, $i_a \neq i_b$, the following relations are satisfied for a predetermined value M1.

$$|i_1-i_2|=p \times m_1$$

$$|i_3-i_4|=p \times m_2$$

$$|p[i_1]-p[i_3]|=p \times m_3$$

$$|p[i_2]-p[i_4]|=p \times m_4$$

$$m_1, m_2, m_3, m_4 < M_1 \qquad \text{[Equations 5]}$$

(Condition 6)
When the period of the convolution code is p and the positions of four arbitrary points of an input signal from 0 to POS are $i_1, i_2, i_3, i_4 \{0 \ldots, POS\}$, $i_a \neq i_b$, the following relations are satisfied for a predetermined value $M_2$.

$$|i_1-i_2|=p \times m_1$$

$$|i_3-i_4|=p \times m_2$$

$$|p[i_1]-p[i_3]|=p \times m_3$$

$$|p[i_2]-p[i_4]|=p \times m_4$$

$$m_1, m_2, m_3, m_4 < M_2 \qquad \text{[Equations 6]}$$

(Condition 7)
When the positions of four arbitrary points of an input signal from 0 to POS are $i_1, i_2, i_3, i_4 \{0 \ldots, POS\}$, $i_a \neq i_b$, the following relations are satisfied for a predetermined value $O_1$.

$$|i_1-i_2|=O_1$$

$$|i_3-i_4|=O_1$$

$$|p[i_1]-p[i_3]| \leq O_1$$

$$|p[i_2]-p[i_4]| \leq O_1 \qquad \text{[Equations 7]}$$

(Condition 8)
When the positions of four arbitrary points of an input signal from 0 to POS are $i_1, i_2, i_3, i_4 \{0 \ldots, POS\}$, $i_a \neq i_b$, the following relation is satisfied for a predetermined value $O_2$.

$$|i_1-i_2|+|i_3-i_4|+|p[i_1]-p[i_3]|+|p[i_2]-p[i_4]| \leq O_2. \qquad \text{[Equation 8]}$$

For example, in the case of a turbo code which comprises a convolution code with a period $p=_3$ as a component code, the aforementioned conditions 1 to 8 are respectively equivalent to detecting the low weighting code word occurrence patterns shown in FIG. 4. The arrows in the diagram show positions in the input bits where 1 was replaced. In this embodiment, only the conditions 1 to 8 were mentioned as examples, but other conditions which detect specific low weighting output patterns may also be added to construct an interleaver having enhanced encoding performance (described hereafter).

In a step S6, it is determined whether or not a substitution pattern corresponding to the aforesaid conditions 1 to 8 was generated. When it is determined that a corresponding substitution pattern exists, the routine proceeds to a step S7 and a flag which shows that a specific substitution pattern exists is set to 1. Also, the value of TRIAL is incremented by 1 in a step S8.

In a step S9, it is determined whether or not the value of TRIAL is equal to (N−POS−1), and when it is determined to be equal, the routine returns to the step S2 and the subsequent processing is repeated. That is, the number of times a substitution position was selected so far for a predetermined POS is examined, and if the processing of the steps S4 to S8 was performed for all the substitution positions stored in q[i] at the time when TRIAL=0, it is determined that a suitable substitution position could not be found, and substitution positions are again determined from the initial position with POS=0.

On the other hand, when it is determined in the step S9 that the value of TRIAL was not equal to the value of (N−POS−1), it is assumed that there are still some substitution position candidates remaining, the routine proceeds to a step S10, r[N−POS−TRIAL] which is the last value of the sequence r[i] is substituted in r[R] which is the currently selected substitution position, the routine returns to the step S4, the subsequent processing is repeated, and the substitution position in p[POS] is selected from r[i].

When it is determined in the step S6 that specific substitution patterns were not generated, the routine proceeds to a step S11, and it is determined whether or not the value of POS is equal to N−1. In other words, it is determined whether or not the entire contents of p[i] were determined.

When it is determined that the entire contents of p[i] were not determined, the routine proceeds to a step S12, a predetermined location of the value stored in p [POS] is searched by the processing of the step S5 in q[i], q[N−POS−1] which is the last value of q[i] is substituted in a sequence q[TP] at the searched location in a step S13, and the value of POS is incremented by 1 to determine the next substitution position in a step S14, so the routine then returns to the step S3 and the subsequent processing is repeated.

On the other hand, when it is determined in the step S11 that the entire contents of p[i] were determined, the substitution position determination of this flow chart is terminated, and the contents of the substitution sequence p[i] (0≦i<N) obtained are stored in the substitution data ROM 84.

Figure 5:
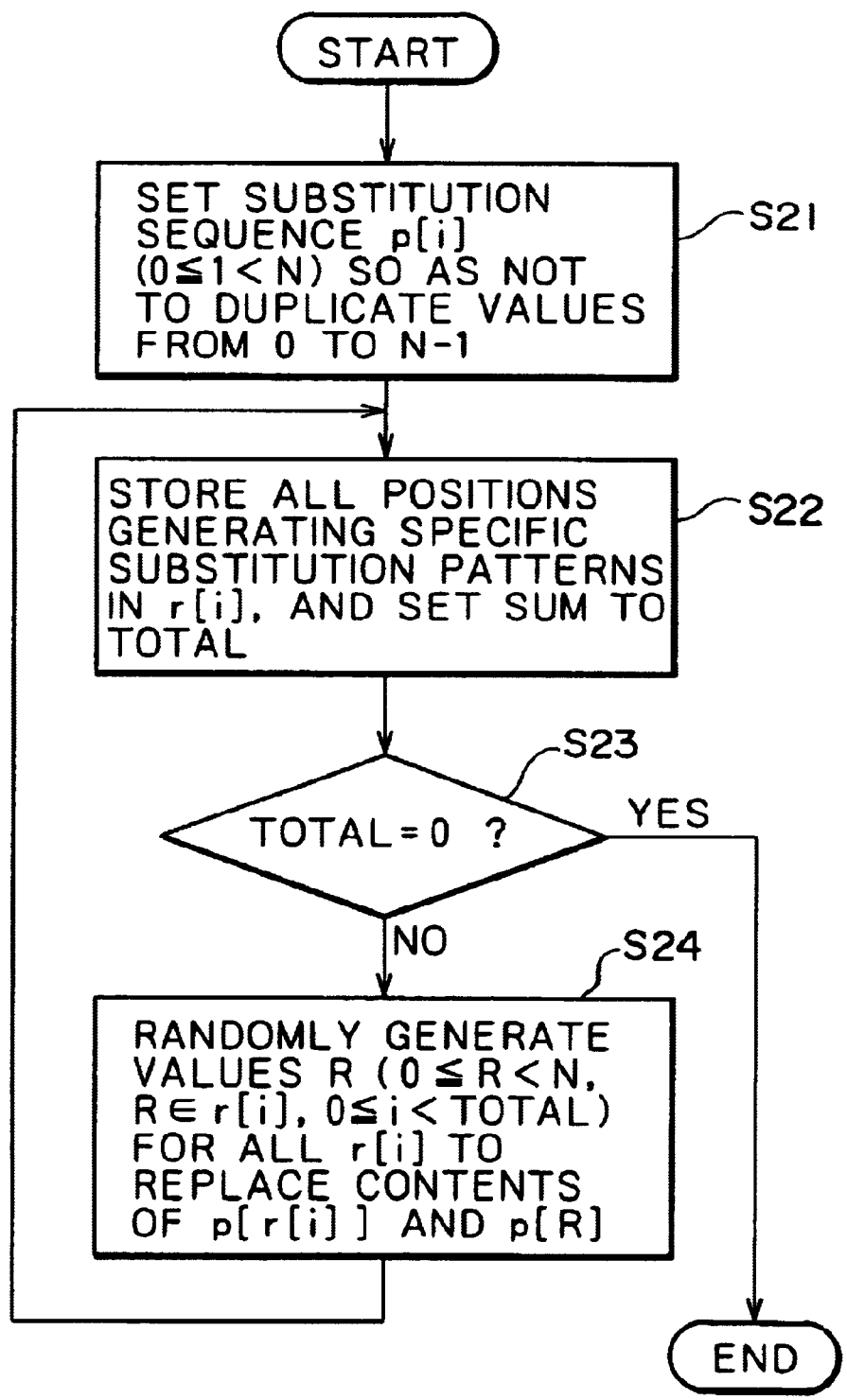
FIG. 5 is a flowchart which describes another process for determining data substitution position information.

Next, as a second embodiment, the case will be described where positions into which positions which generate specific substitution patterns are substituted, are rearranged based on randomly generated substitution positions referring to the flowchart of FIG. 5.

In a step S21, a sequence p[i] (0≦i<N) is set so that there is no duplication in the values from 0 to (N−1). Next, in a step S22, all positions for which specific substitution patterns are generated in the sequence p[i] are examined, the information is stored in the sequence r[i], and the sum of this information is set as a value TOTAL. That is, information about $i_1, i_2, i_3, i_4$ which satisfy one or more of the conditions 1 to 8 shown in the aforesaid first embodiment are stored in r[i], and the number of this information is set as the value of TOTAL.

When any of the values $i_1, i_2, i_3, i_4$ is already stored in the sequence r[i], this value is not stored in r[i]. In a step S23, it is determined whether or not TOTAL is 0. In other words, it is determined whether or not specific substitution patterns were generated, and when it is determined that they were not generated, the substitution position determination of this flowchart is terminated, and the contents of the substitution sequence p[i] (0≦i<N) obtained are stored in the substitution data ROM 84.

On the other hand, when it is determined in the step S23 that TOTAL is not 0, i.e., when it is determined that specific substitution patterns were generated, the routine proceeds to a step S24, positions which do not generate the specific substitution patterns, i.e., predetermined values j not contained in r [i] (0≦j<N), are randomly selected, and processing which replaces p[r[1]] by p[j] for all r[i] is performed. The routine then returns to the step S22, and the subsequent processing is repeated.

Figure 6:
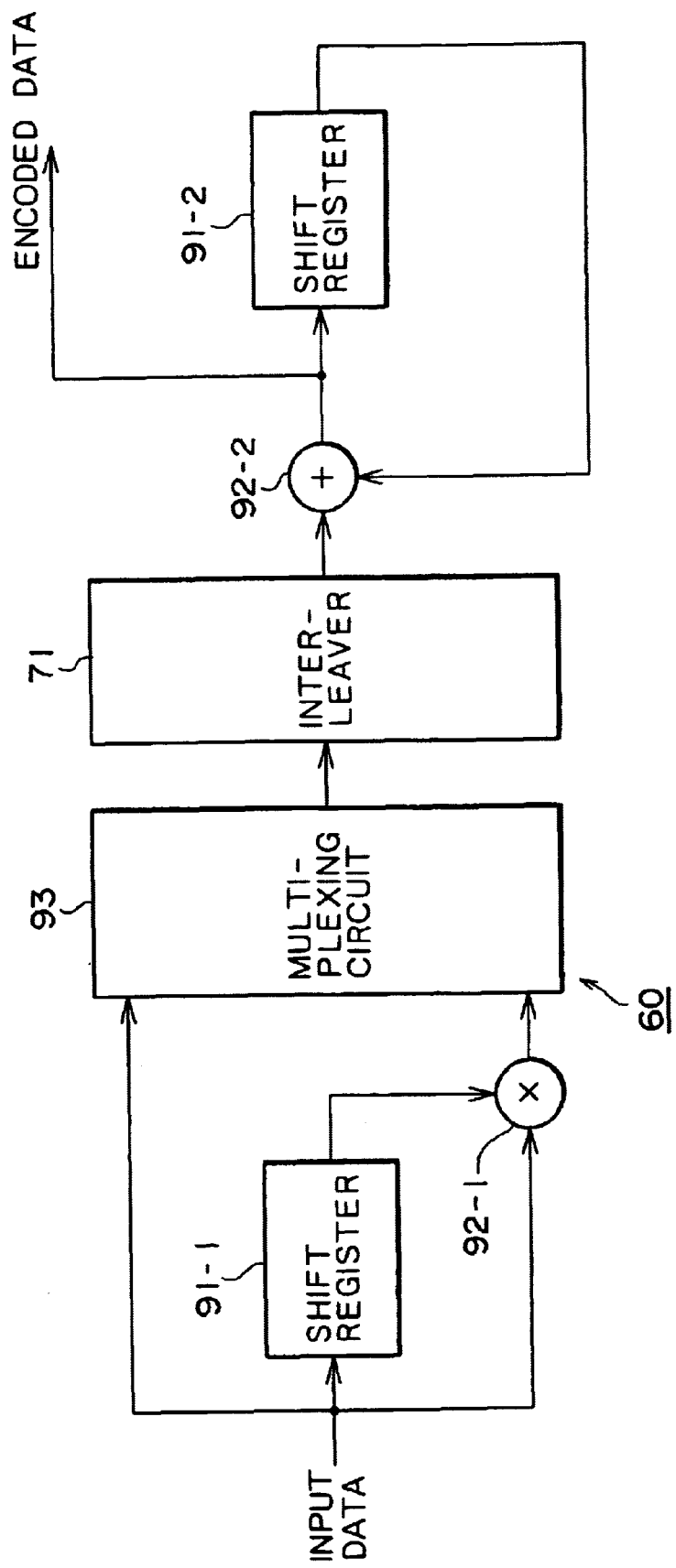
FIG. 6 is a block diagram showing another example of the construction of the turbo encoding device 60.

FIG. 6 is a block diagram showing an example of another construction of the turbo encoding device 60. Data input into the turbo encoding device 60 are input into a shift register 91-1, EXOR circuit 92-1 and a multiplexing circuit 93. Data output from the shift register 91-1 are also input to the EXOR circuit 92-1. The data output from the EXOR circuit 92-1 are input to the multiplexing circuit 93 in addition to data input directly to the turbo encoding device 60. The data input to the multiplexing circuit 93 are multiplexed, and output to the interleaver 71.

The output from the interleaver 71 is output as encoded data via an EXOR circuit 92-2, and output also to a shift register 91-2. The output from the shift register 91-2 is output to the EXOR circuit 92-2.

The operation of the turbo encoding device 60 will now be described for the case where the data "1100 . . . " are input as an example. The input data are converted to the encoded data 1010 . . . " as an external code by the shift register 91-1 and EXOR circuit 92-1, and input to the multiplexing circuit 93. "1100 . . . " and "1010 . . . " are therefore input as input data to the multiplexing circuit 93. The multiplexing circuit 93 multiplexes this data and outputs the data "1110010 . . . " to the interleaver 71.

The interleaver 71 mixes up the input data. This mixing is performed according to the substitution position data generated according to the first embodiment or second embodiment described above.

For example, if the data input to the interleaver 71 is converted to data having the pattern "0 . . . 0110, 0110 . . . 0" by this mixing, the encoded data output via the EXOR circuit 92-2 becomes the data "0 . . . 0100 . . . 0100 . . . 0" with a weighting of 2.

Figure 7:
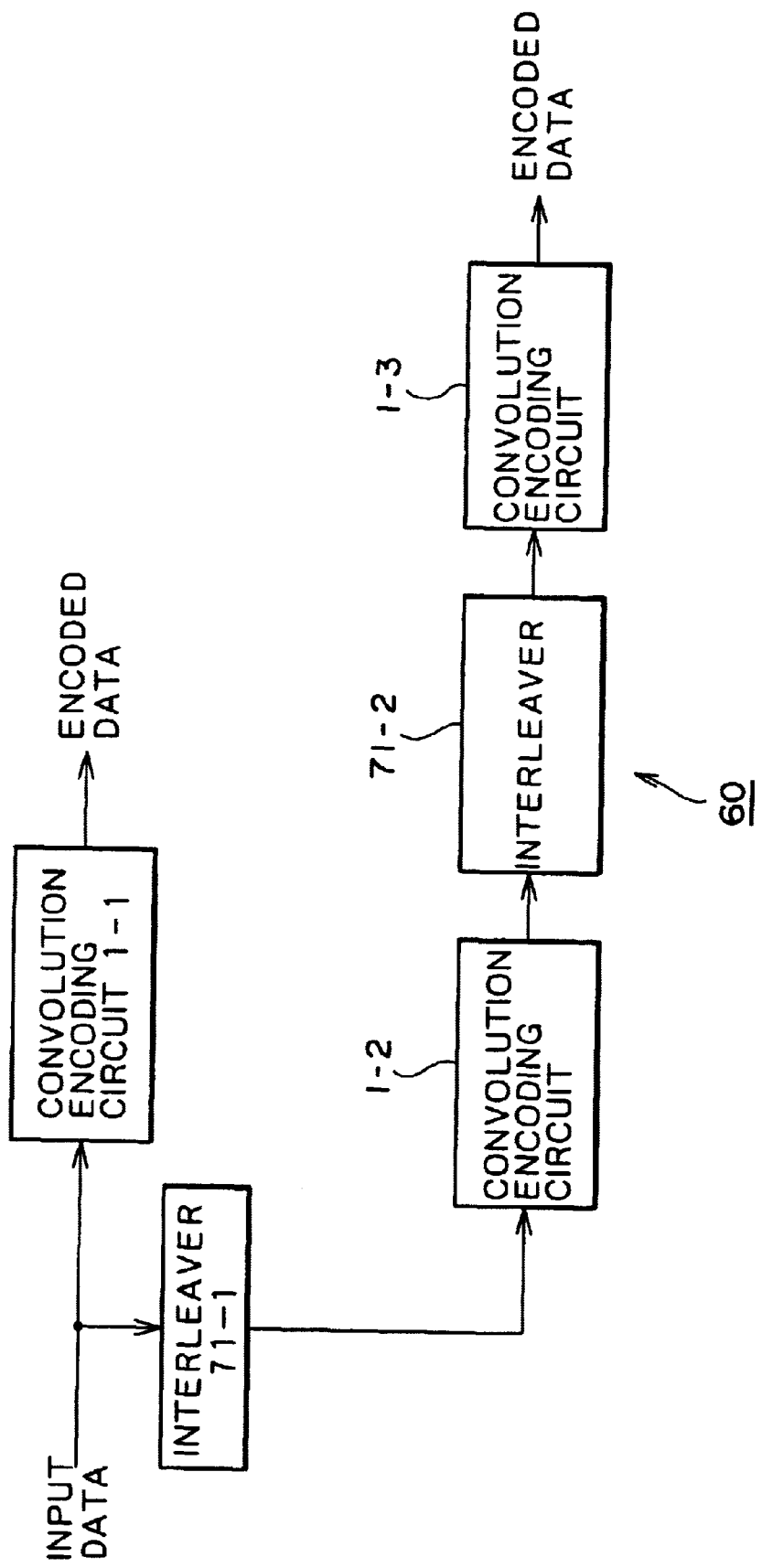
FIG. 7 is a block diagram showing yet another example of the construction of the turbo encoding device 60.

FIG. 7 is a block diagram showing the construction of yet another turbo encoding device 60. In this construction, data input to the turbo encoding device 60 are input to the convolution encoding circuit 1-1 and the interleaver 71-1. The data input to the convolution encoding circuit 1-1 are mixed up, output to the interleaver 71-2 via the convolution encoding circuit 1-2, and then output to the convolution encoding circuit 1-3.

These interleavers 71-1, 71-2 mix up the input data according to the substitution position data generated according to the first embodiment or second embodiment described above.

Hence, the substitution position data generated by the first embodiment or second embodiment can be applied to interleavers of a turbo encoding device having various constructions.

Figure 8:
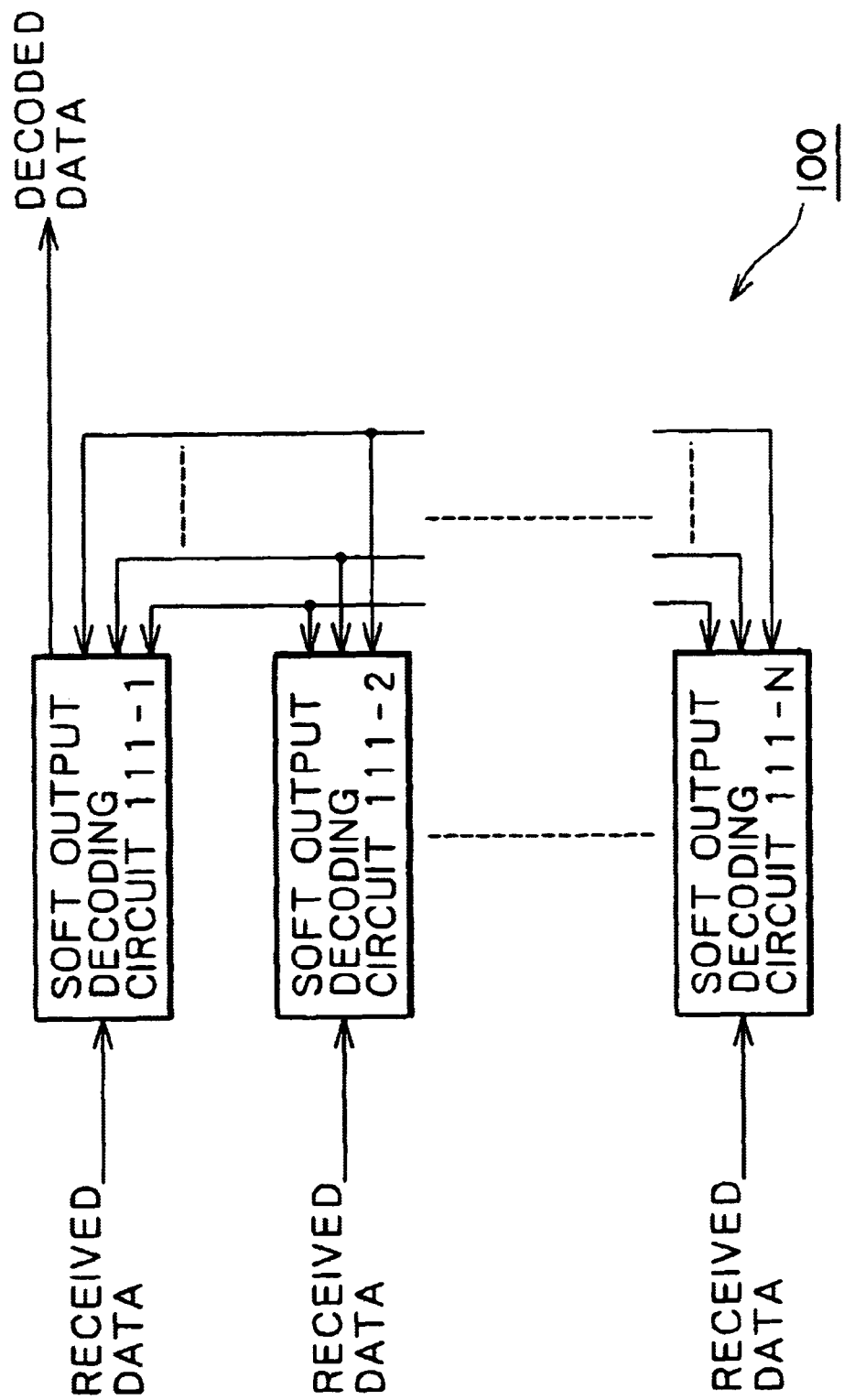
FIG. 8 is a block diagram showing the construction of a turbo decoding device 100.

FIG. 8 shows the construction of a turbo decoding device 100. This turbo decoding device 100 decodes the encoded data output from the turbo encoding device 60 shown in FIG. 1 so as to obtain decoded data.

This turbo decoding device 100 comprises plural soft output decoding circuits 111-1 to 111-N corresponding to the number of encoded data (received data) output from the turbo encoding device 60. The soft output decoding circuits 111 use a "soft output decoding scheme" having the function of a MAP decoder or SOVA decoder which compute the probability of the input data being 0 or 1 on the encoding side. The soft output decoding circuits 111 comprise interleavers which perform the reverse processing to that performed by the interleavers 2 of the turbo encoding circuit 60 of FIG. 1.

Figure 9:
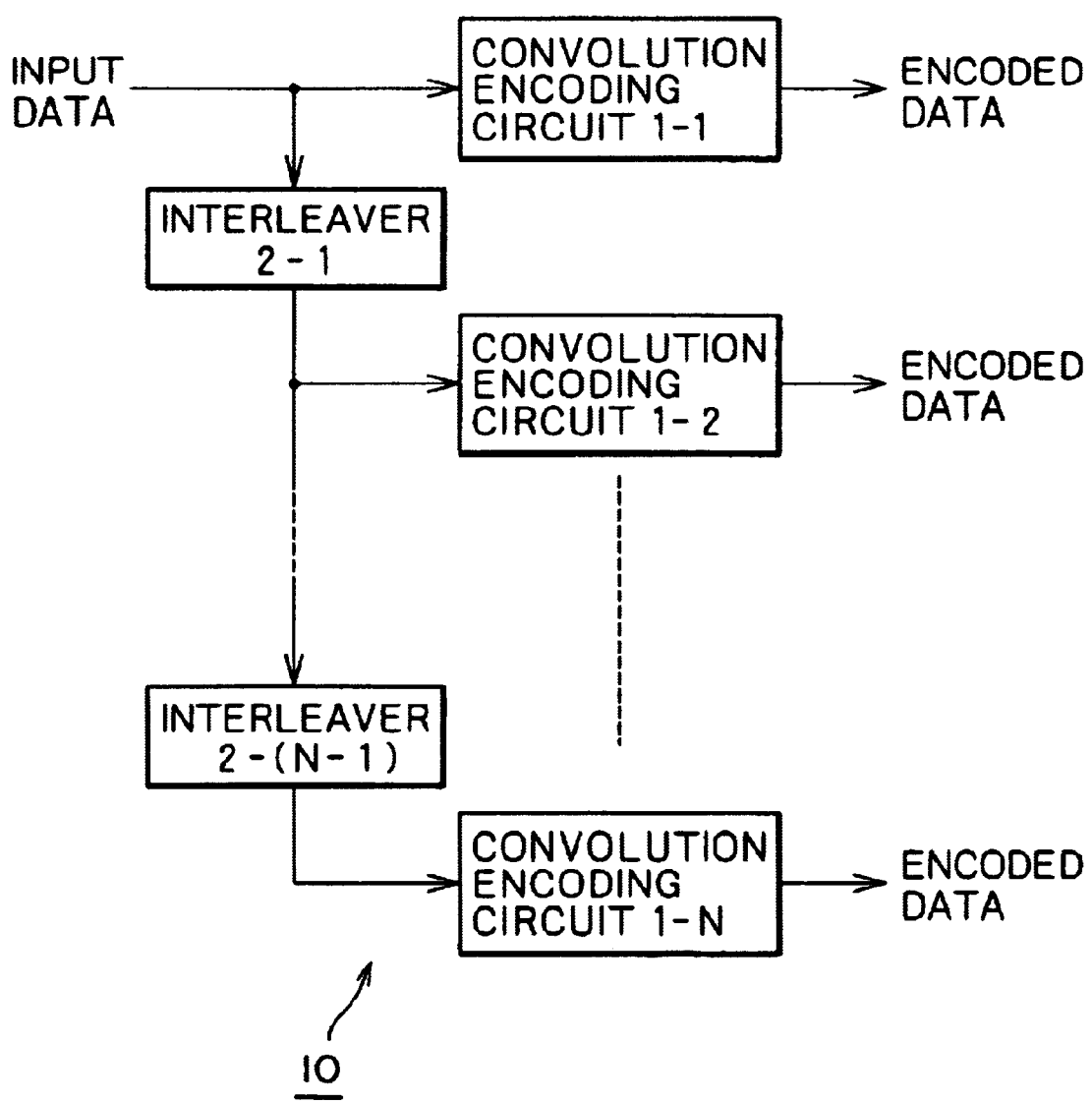
FIG. 9 is a block diagram showing the construction of a turbo encoding device 10 according to the prior art.

The operation of the turbo decoding device 100 shown in FIG. 8 will now be described. Received data (encoded data) is supplied to the soft output decoding circuits 111-1 to 111-N, respectively. In the decoding circuits 111, repetitive decoding operations are respectively performed several times or several tens of times, making common use of estimated probability value data, on the input data on the encoding side. The final decoded data is output from any of the decoding circuits (the decoding circuit 111-1 in FIG. 9).

In this way, in the aforesaid first and second embodiments, interleaver substitution positions are formulated so as to remove plural, specific substitution patterns giving a small output code word weighting without leaving any such patterns. This increases the minimum distance of the code, and makes it possible to provide a turbo encoding device and turbo decoding device having high error correction performance.

According to the aforesaid first and second embodiments, eight conditions were described for detecting specific substitution patterns, but an interleaver can be constructed by adding further conditions for detecting specific low weighting output patterns to enhance coding performance.

Next, a third embodiment of this invention will be described.

As already described in the section [Object of the Invention], to obtain high error correction performance in turbo encoding and decoding, an interleaver should mix up input data to increase the output code word weighting (i.e., the number of "1"s in an output bit sequence) as much as possible for any input, in order to increase the minimum distance of a code. However, even in the aforesaid first and second embodiments, some of the interleaves giving a small output code word weighting were still not removed.

Figure 13:
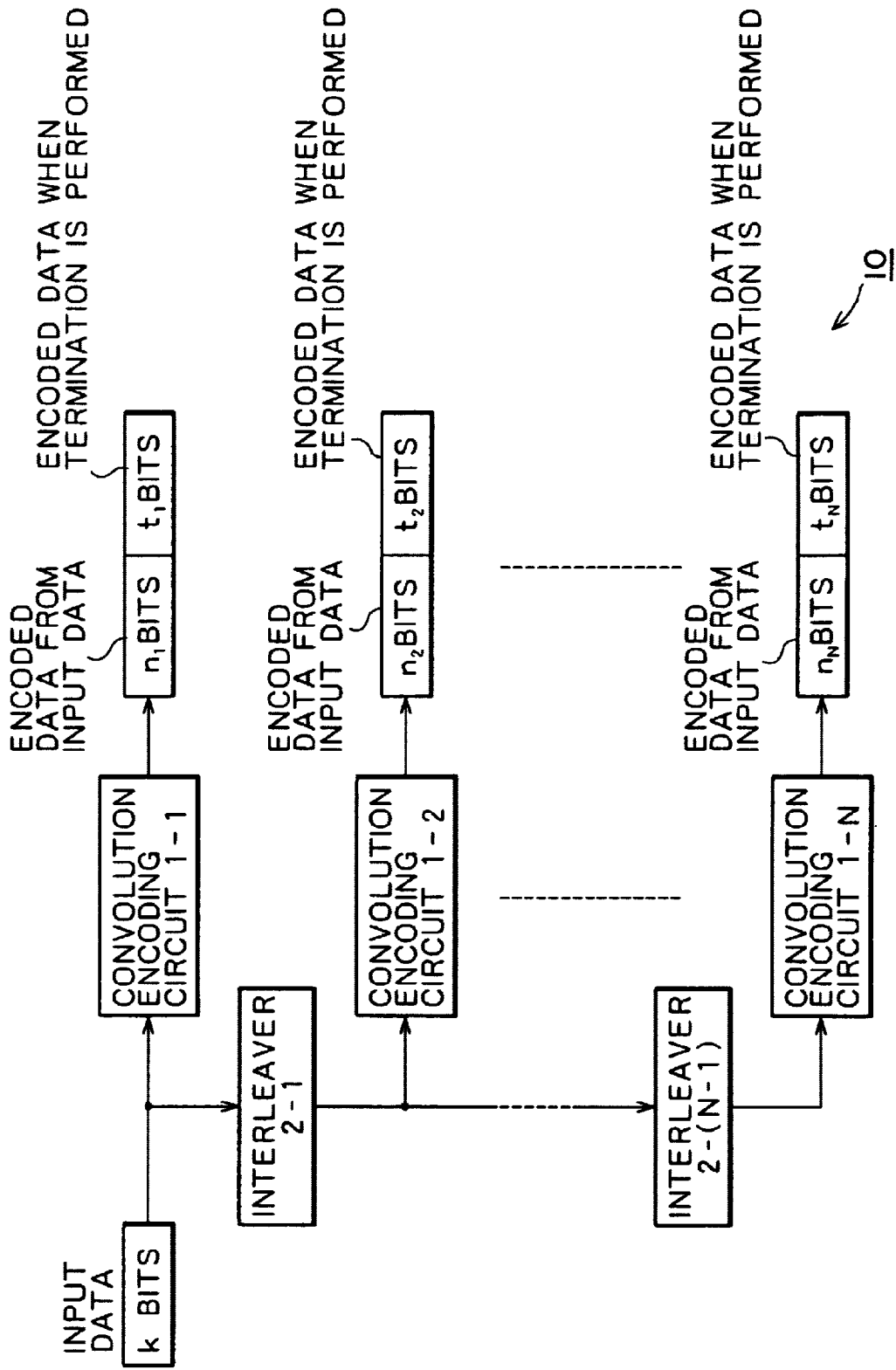
FIG. 13 is a diagram showing the relation of numbers of bits of input data and encoded data in the turbo encoding device 10.
Figure 14:
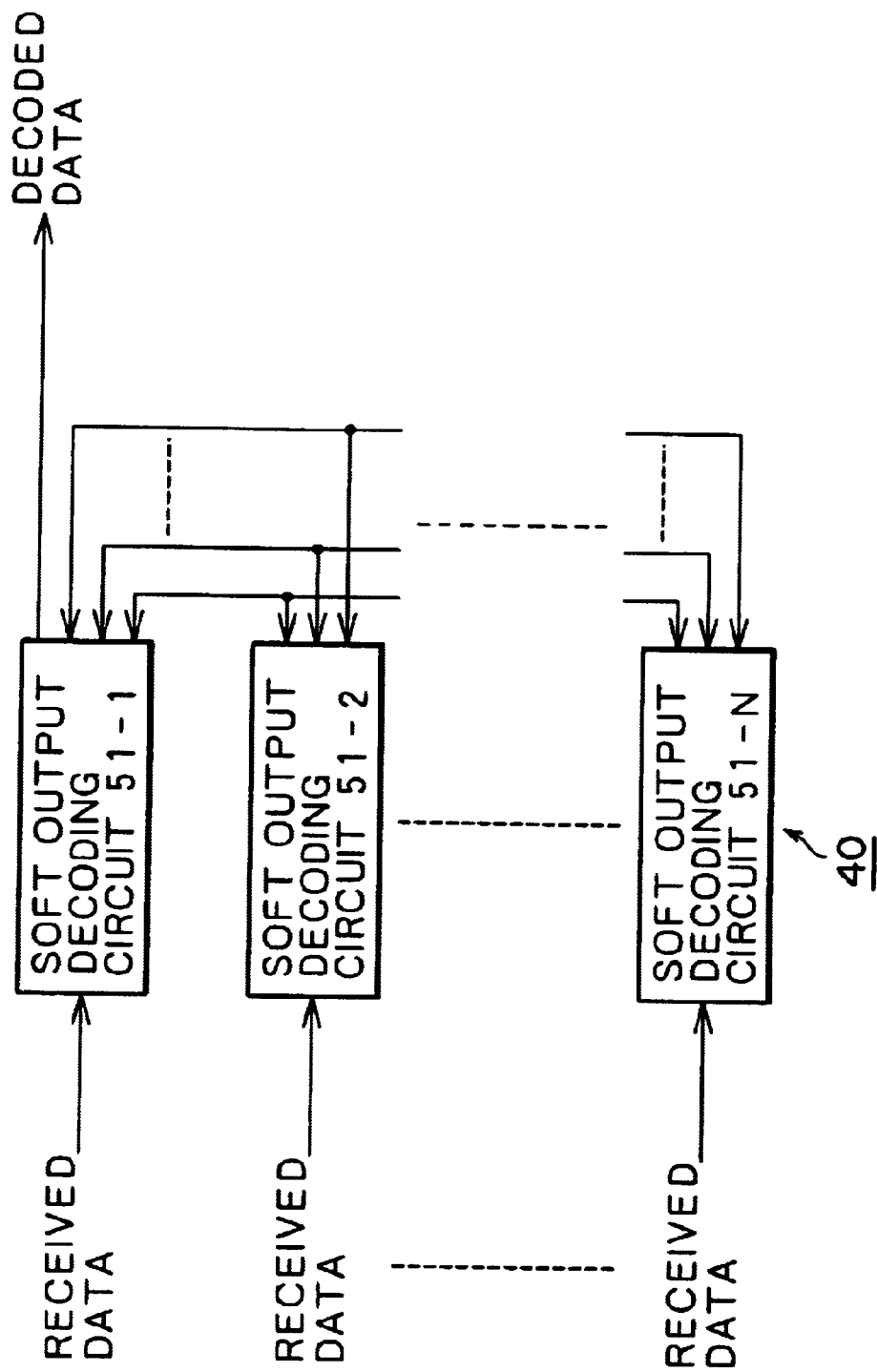
FIG. 14 is a block diagram showing the construction of a turbo decoding device 40.
Figure 15:
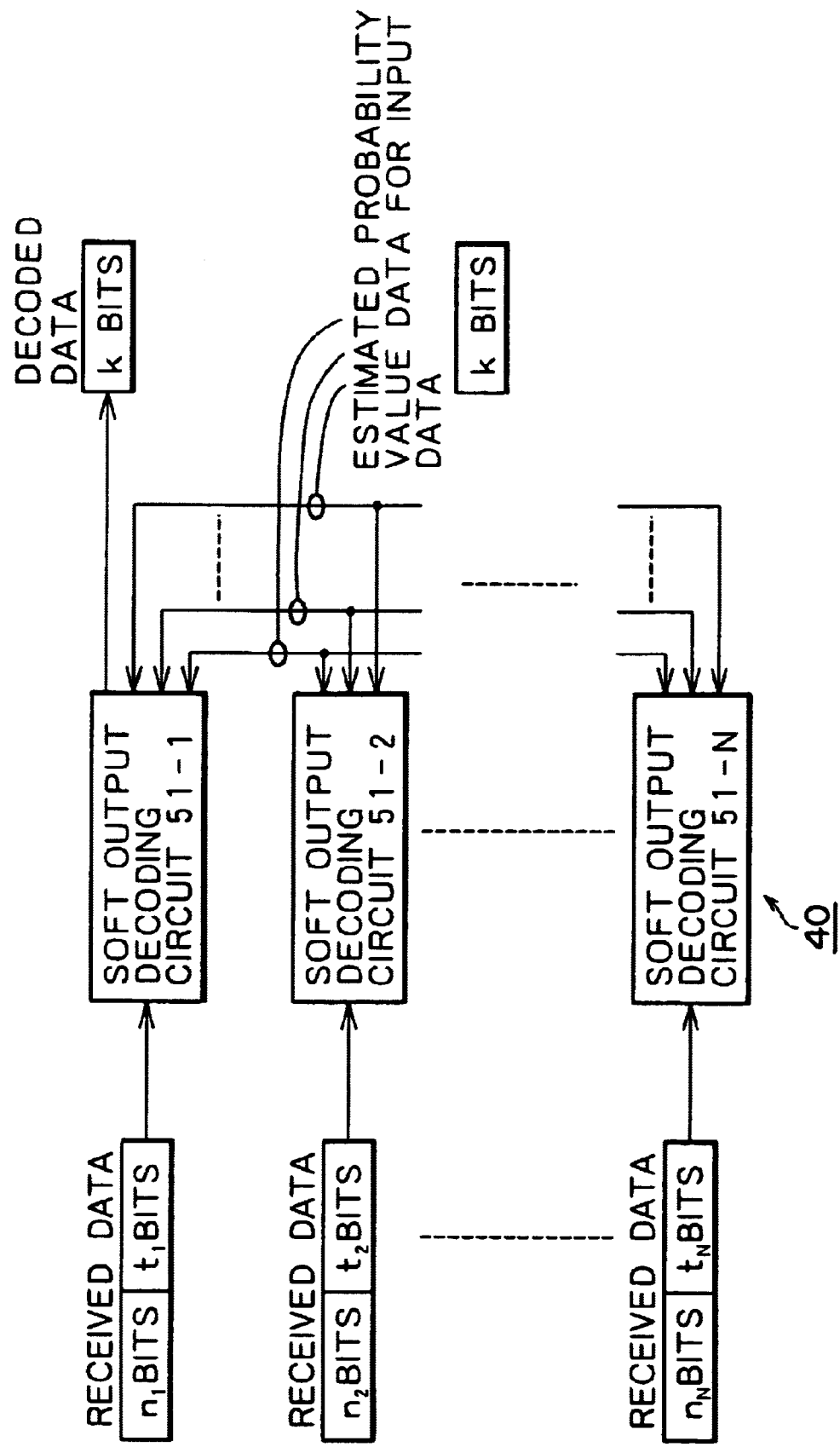
FIG. 15 is a diagram showing the relation of numbers of bits between received data and estimated probability value data in the turbo decoding device 40.
Figure 16:
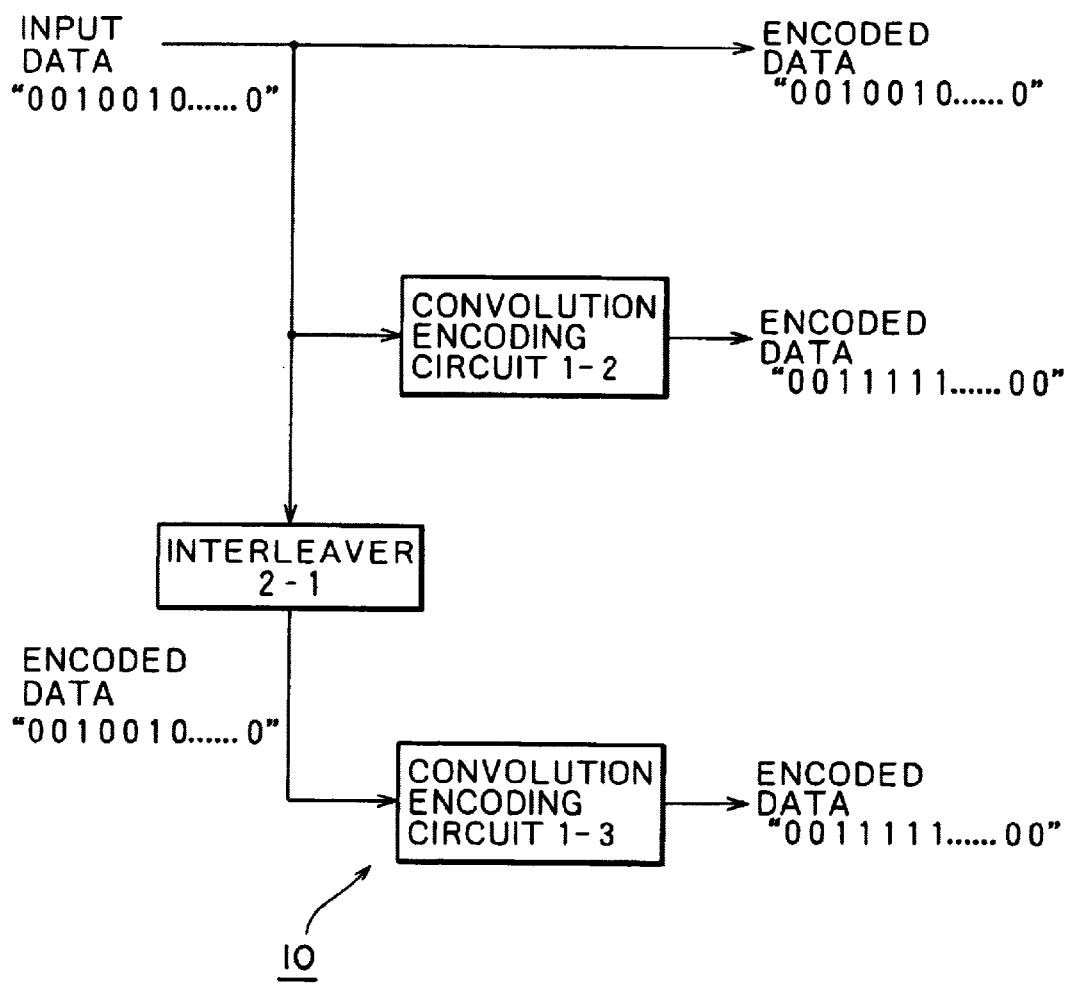
FIG. 16 is a diagram which describes input data and encoded data.
Figure 17:
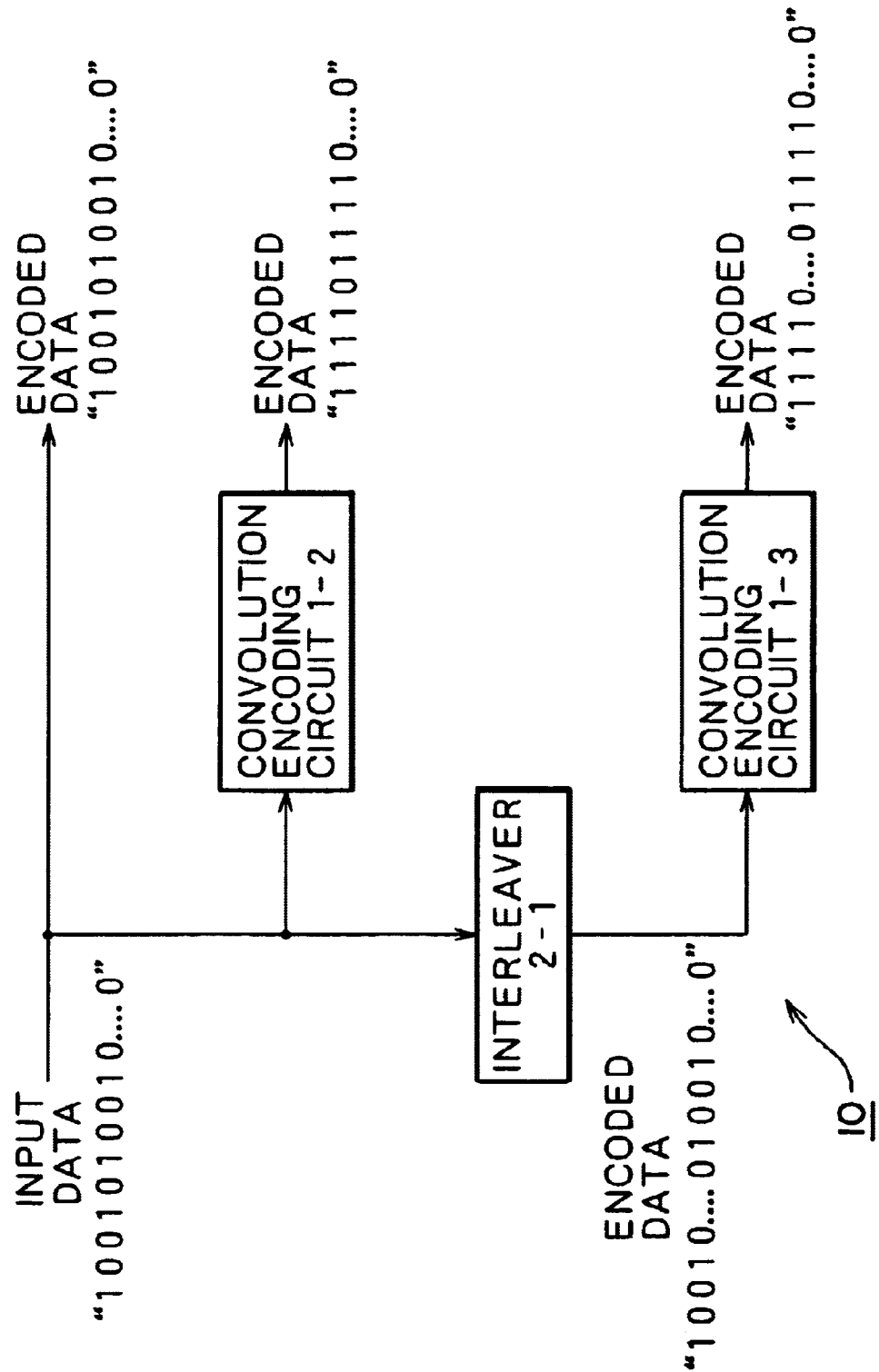
FIG. 17 is a diagram which describes input data and encoded data.

More specifically, as already described referring to FIG. 13, data is supplied to the turbo decoding device side in the form (n+t) wherein a t bit termination code is added to n bits of encoded data. In both of the aforesaid embodiments, the effect of this termination bit was not considered. In other words, patterns giving a low output code word weighting due to the effect of the termination bit added to the encoded data were not removed, and there was therefore a certain limitation on the construction of turbo encoding and decoding systems having a high error correction performance.

Figure 19:
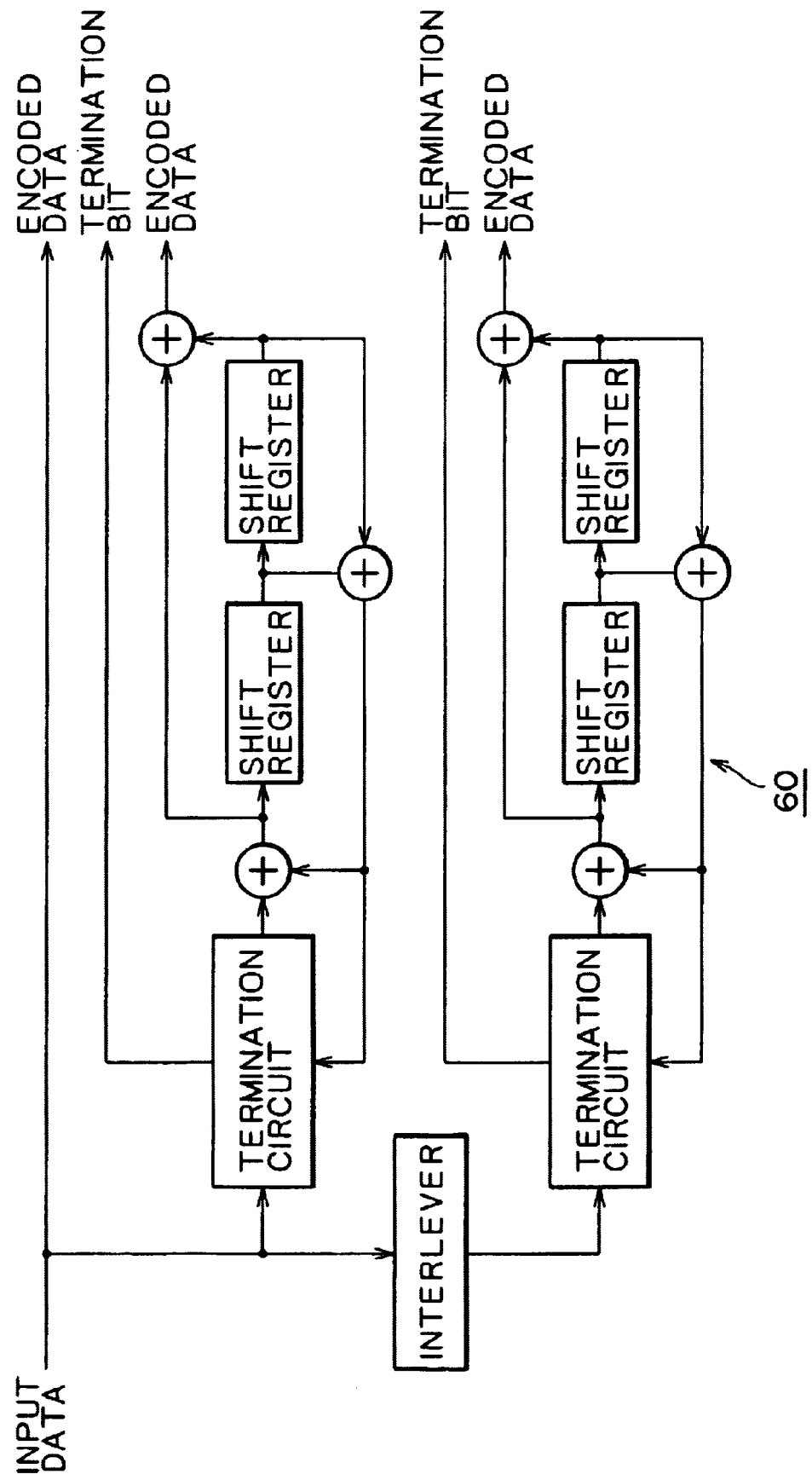
FIG. 19 is a diagram showing an example of the construction of a turbo encoding device 60.

For example, consider the case where the turbo encoder 60', which outputs two convolution encoded data shown in FIG. 19, is implemented by an interleaver comprising a substitution data ROM which specifies the relation between the input data positions and substitution data positions shown below (the convolution encoding circuits forming the turbo encoding device 60' are represented by the state transition diagram shown in FIG. 18, and therefore the period p is 3)

TABLE 3

| Input data position | | | | | | | | | | | | | | | | | | | | |
|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 |
| Substitution data position | 10 | 28 | 3 | 18 | 13 | 22 | 6 | 26 | 1 | 19 | 12 | 5 | 24 | 30 | 15 | 20 | 8 | 27 | 0 | 16 |

| | Input data position | | | | | | | | | | | |
|---|---|---|---|---|---|---|---|---|---|---|---|---|
| | | 20 | 21 | 22 | 23 | 24 | 25 | 26 | 27 | 28 | 29 | 30 | 31 |
| | Substitution data position | 4 | 25 | 9 | 14 | 2 | 23 | 31 | 17 | 11 | 21 | 29 | 7 |

Figure 20:
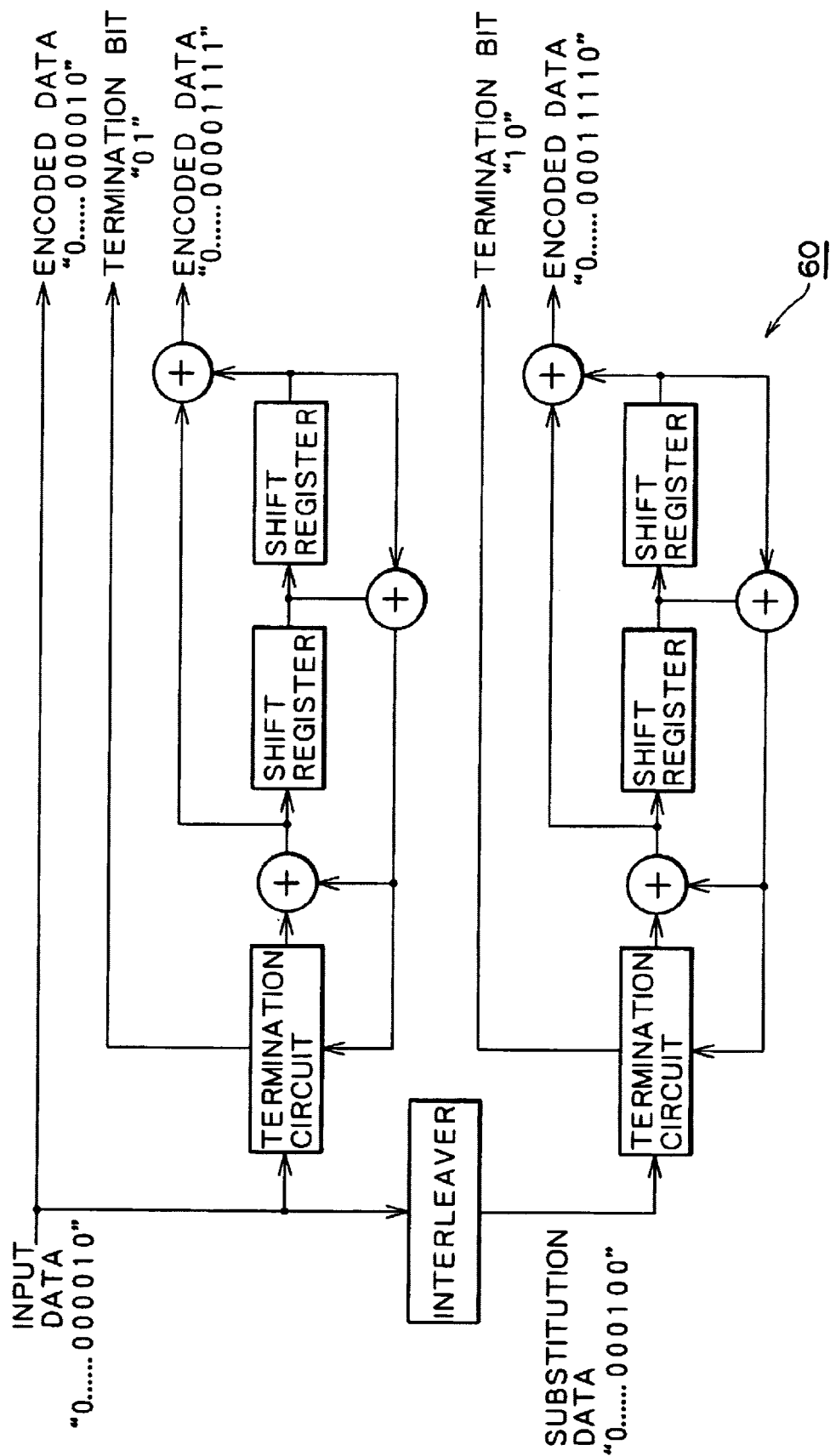
FIG. 20 is a schematic representation of operating characteristics when the data "0 . . . 000010" is input to turbo encoding device 60' shown in FIG. 19.

Suppose that "0, . . . 000010" is input to the turbo encoding device 60' using this interleaver. The operating characteristics in this case are shown in FIG. 20. The input bit sequence is supplied as it is to the first convolution encoding circuit, and the termination bit is 01. The "1" which is 2nd from last in the input bit sequence is replaced by the 3rd from last by the interleaver according to the substitution data position relations shown in the immediately preceding paragraph. As a result, the bit string "0 . . . 000100" is supplied to the second convolution encoding circuit, and the termination bit is 10. For this reason, a code word having the very small weighting of 11 is output as the sum.

Figure 21:
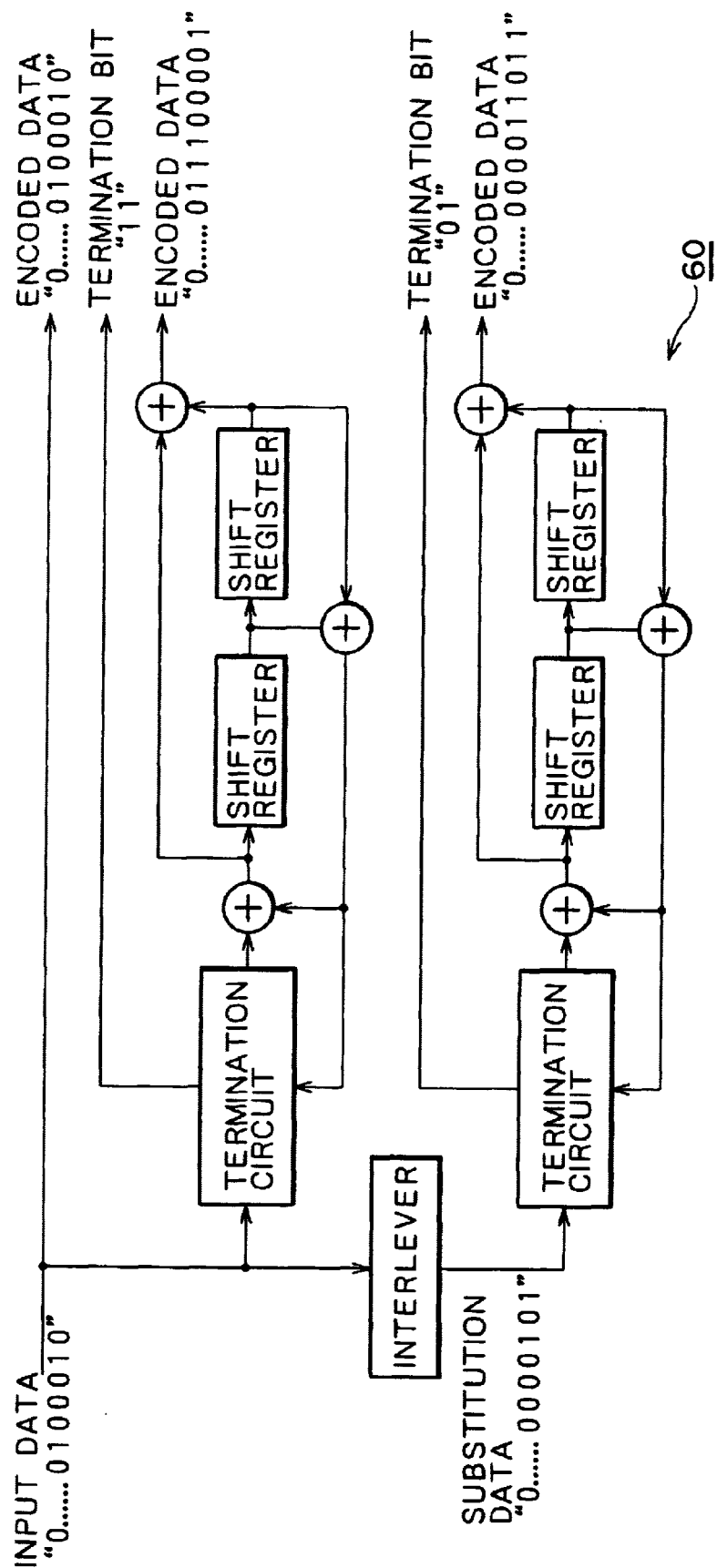
FIG. 21 is a schematic representation of operating characteristics when the data "0 . . . 0100010" is input to turbo encoding device 60' shown in FIG. 19.

FIG. 21 shows the operating characteristics when "0 . . . 0100010" is input to the turbo encoding device 60'. The input bit sequence is supplied as it is to the first convolution encoding circuit, and the termination bit is 11. The "1" which is 26th in the input bit sequence is replaced by the 31st by the interleaver according to the substitution data position relations shown two paragraphs earlier. As a result, the bit string "0 . . . 000101" is supplied to the second convolution encoding circuit, and the termination bit is 01. For this reason, a code word having the very small weighting of 13 is output as the sum.

The third embodiment of this invention, which was conceived in view of this technical problem, comprises an interleaver which suppresses substitution by patterns giving a low output weighting and increases the output weighting of code words even when a termination bit is added to the encoded data, i.e., it very much increases the minimum distance of the output code.

Figures 11, 12:
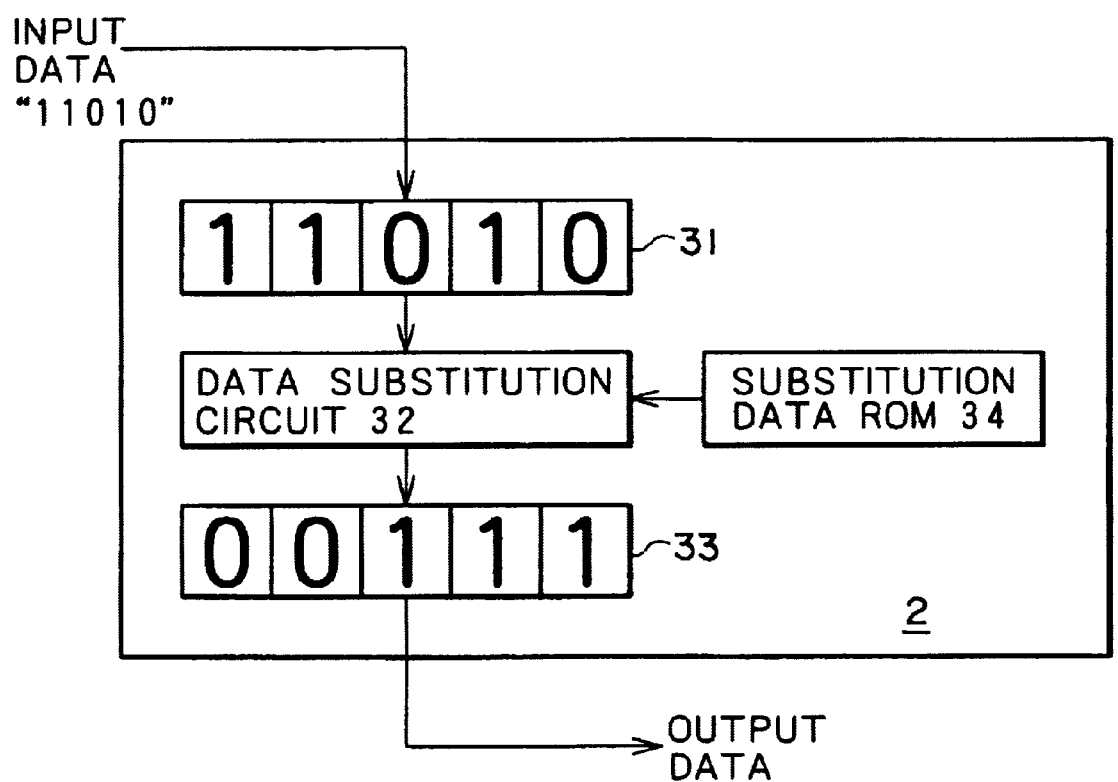
FIG. 11 is a block diagram showing the construction of interleavers 2.
FIG. 12 is a diagram which describes data stored by a substitution data ROM 34.

The actual construction of the interleaver according to the third embodiment is substantially identical to that of the prior art shown in FIG. 11, so no further description of it will be given here. However, in the construction of an interleaver which does not generate specific substitution patterns, the substitution position data stored in the substitution data ROM 34 are different. This substitution position data also suppresses the occurrence of patterns giving a low output weighting when a termination bit is added.

Figure 22:
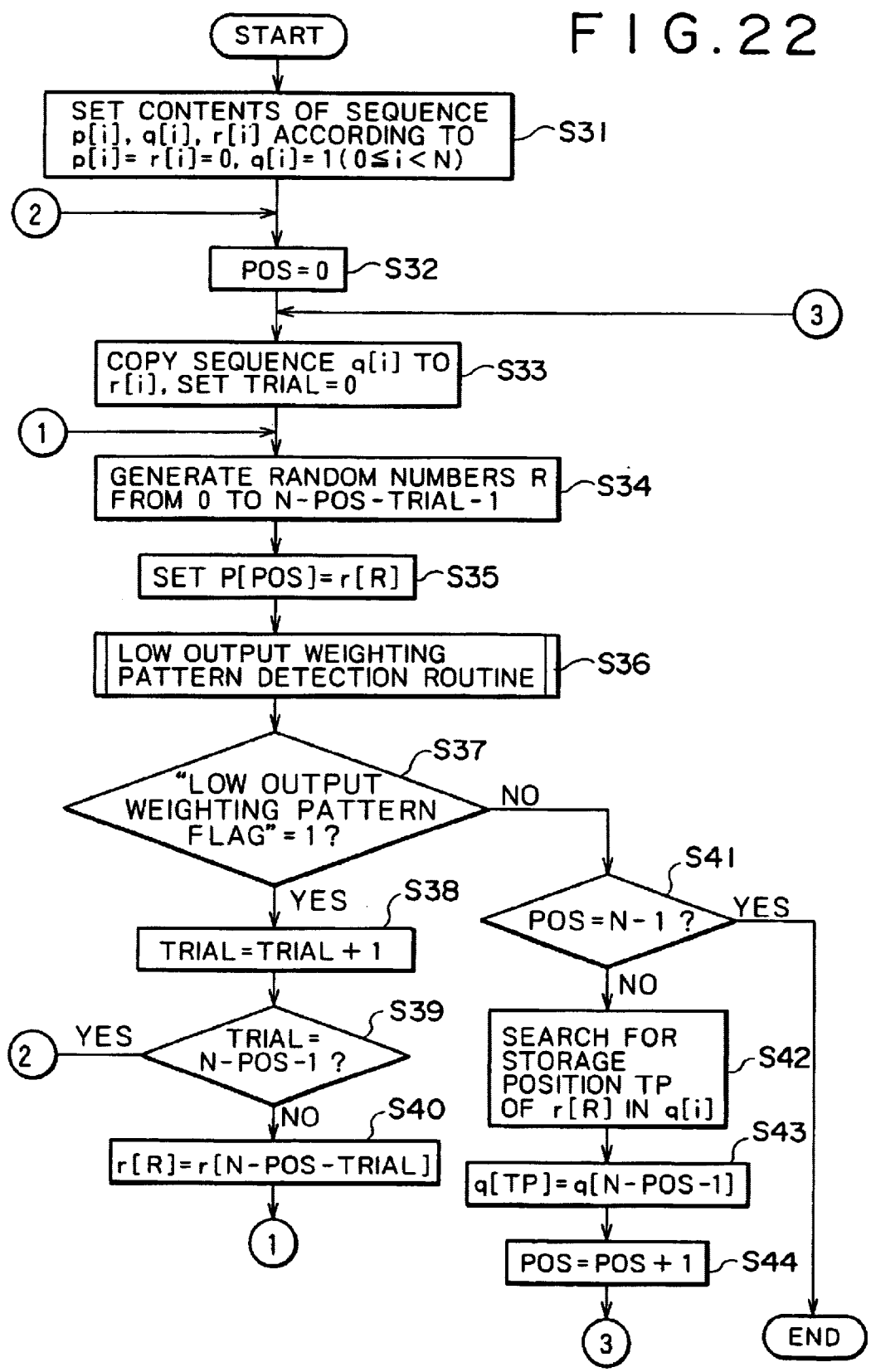
FIG. 22 is a flowchart showing an example of an algorithm for generating substitution position data relating to the third embodiment of this invention.

FIG. 22 shows an example of an algorithm for generating the substitution position data which should be stored in the substitution data ROM 84 in the form of a flowchart. Essentially, this algorithm is a scheme wherein substitution positions are successively determined while checking for the presence or absence of specific substitution patterns. Hereafter, each step in the flowchart will be described.

First, in a step S31, the sequence p[i] which stores the substitution position data and sequence the q[i] for storing substitution candidate positions are initialized, and in a step S32, the value of the parameter POS is set to0 which is an initial value.

In a step S33, the value of TRIAL is set to0 which is an initial value, and the sequence q[i] is copied to the sequence r[i].

The 0th to (N−1)th data of q[i] contain substitution positions not yet stored in p[i], and r[i] contain substitution position candidates which remain in each stage of a trial performed when substitution positions are determined for a predetermined POS.

Hereafter, in a step S34 and subsequent steps, the substitution positions stored in p[i] are sequentially determined starting from the 0th. That is, in the step S34, random numbers R which take values from 0 to (N−POS−TRIAL−1) are generated, and in a step S35, p[POS]=r[R] is set.

Next, in a step S36, it is determined whether or not specific substitution patterns or low output weightings due to the effect of the termination bit added to the encoded data are generated when the p[0]-p[POS]th substitution positions are examined according to the low output weighting pattern detection routine already defined. Detailed information about this low output weighting pattern detection routine will be given later.

When a low output weighting pattern is generated, a bit "1" is set to a "low output weighting pattern FLAG" by the preceding step S36. In a determining block S37, it is determined whether or not a low output weighting pattern has been generated from the value of this flag.

When it is determined that the low output weighting pattern was generated, the routine proceeds to a step S38, and processing which reselects substitution positions is performed. Specifically, in the step S38, the variable TRIAL is incremented by "1", and in a next step S39, it is determined whether or not the value of TRIAL is equal to (N−POS−1).

An affirmative result of the determining block S39 means that, considering the number of times selection of substitution positions was performed until now, a suitable substitution position could not be found in the processing of the steps S34–S38 for all the substitution positions stored in q[i] at the time TRIAL=0. In this case, the routine returns to the step S32 and the determination of substitution positions is repeated from the initial input data position with POS=0.

A negative result of the determining block S39 means that some substitution position candidates still remain. In this case, the routine proceeds to the next step S40, r[N−POS−TRIAL] which is the last value of the sequence r[i] is substituted in r[R] which is the currently selected substitution position, the routine returns to the step S34, identical processing to that described hereabove is repeated, and substitution positions in p[POS] are selected from r[i].

On the other hand, when it is determined in the determining block S37 that a low output weighting pattern has not occurred, the routine proceeds to a step S41, and it is determined whether or not POS has reached N−1, i.e., whether or not the entire contents of p[i] have been determined.

When the entire contents of p[i] have been determined, the routine proceeds to the YES branch of the determining block S41, and the whole processing routine is terminated. The contents of the substitution sequence $p[i](0 \leq i < N)$ obtained are stored in the substitution data ROM 34.

Conversely, if some p[i] still remain, a location TP having the value stored in p[POS] in the step S35 is searched (step S42), and subsequently, q[N−POS−1] which is the last value of the sequence q[i] is substituted in q[TP] (step S43). POS is then incremented by 1, the routine returns to the step S33, and identical processing to that described above is performed on the next data positions.

Next, the low output weighting detection routine of the step S36 will be described in detail. This detection routine has the main feature that it detects the low output weighting produced due to the effect of the termination bit added to the end of the encoded data.

In this detection routine, it is determined whether or not, in addition to the eight conditions, Condition 1–Condition 8 shown in the aforesaid embodiment 1, at least one of the fifteen conditions shown below, Condition 2-1–Condition 2-15, holds. Whereas Condition 1–Condition 8 detected specific substitution patterns which gave rise to a low output weighting (described above), Condition 2-1–Condition 2-15 detect substitution patterns which give rise to a low output weighting due to the effect of the termination bit.

(Condition 2-1)

If the interleaver size is N, and the position of one arbitrary point of an input signal from 0 to POS is $\forall i \{0, \ldots, POS\}$, the following relations are satisfied for a predetermined value $S_3$.

$$N-i \leq S_3$$

$$N-p[i] \leq S_3 \qquad \text{[Equations 9]}$$

(Condition 2-2)

If the interleaver size is N, and the position of one arbitrary point of an input signal from 0 to POS is $\forall i \{0, \ldots, POS\}$, the following relations are satisfied for a predetermined value $S_4$.

$$(N-i)+(N-p[i]) \leq S_4 \qquad \text{[Equations 10]}$$

If the interleaver size is N, and the position of two arbitrary points of an input signal from 0 to POS is $\forall i_1, \forall i_2 \{0, \ldots, POS\}$, $i_a \neq i_b$ (a≠b), the following relations are satisfied for a predetermined value S5.

$$N-i_1 \leq S_5$$

$$N-i_2 \leq S_5$$

$$N-p[i_1] \leq S_5$$

$$N-p[i_2] \leq S_5 \qquad \text{[Equations 11]}$$

(Condition 2-4)

If the interleaver size is N, and the position of two arbitrary points of an input signal from 0 to POS is $\forall i_1, \forall i_2 \{0, \ldots, POS\}$) $i_a \neq i_b$ (a≠b), the following relations are satisfied for predetermined values $S_6$ and $L_3$.

$$N-i_1 \leq S_6$$

$$N-i_2 \leq S_6$$

$$|p[i_1]-p[i_2]| \leq p.l$$

$$1 < L_3 \qquad \text{[Equations 12]}$$

(Condition 2-5)

If the interleaver size is N, and the position of two arbitrary points of an input signal from 0 to POS is $\forall i_1, \forall i_2 \{0, \ldots, POS\}$, $i_a \neq i_b$ (a≠b), the following relations are satisfied for predetermined values $S_7$ and $L_4$.

$$|i_1-i_2| \leq p.l$$
$$N-p[i_1] \leq S_7$$
$$N-p[i_2] \leq S_7$$
$$l < L_4 \quad \text{[Equations 13]}$$

(Condition 2-6)

If the interleaver size is N, and the position of three arbitrary points of an input signal from 0 to POS is $\forall i_1, \forall i_2, \forall i_3 \{0, \ldots, POS\}$, $i_a \neq i_b$ (a≠b), the following relations are satisfied for a predetermined value $S_8$.

$$N-i_1 \leq S_8$$
$$N-i_2 \leq S_8$$
$$N-i_3 \leq S_8$$
$$N-p[i_1] \leq S_8$$
$$N-p[i_2] \leq S_8$$
$$N-p[i_3] \leq S_8 \quad \text{[Equations 14]}$$

(Condition 2-7)

If the interleaver size is N, and the position of three arbitrary points of an input signal from 0 to POS is $\forall i_1, \forall i_2, \forall i_3 \{0, \ldots, POS\}$, $i_a \neq i_b$, the following relations are satisfied for predetermined values $S_9$ and $L_5$.

$$N-i_1 \leq S_9$$
$$N-i_2 \leq S_9$$
$$N-i_3 \leq S_9$$
$$|p[i_1]-p[i_2]| \leq p.l$$
$$N-p[i_3] \leq S_9$$
$$l < L5 \quad \text{[Equations 15]}$$

(Condition 2-8)

If the interleaver size is N, and the position of three arbitrary points of an input signal from 0 to POS is $\forall i_1, \forall i_2, \forall i_3 \{0, \ldots, POS\}$, $i_a \neq i_b$, the following relations are satisfied for predetermined values $S_{10}$ and $L_6$.

$$|i_1-i_2| \leq p.l$$
$$N-i_3 \leq S_{10}$$
$$N-p[i_1] \leq S_{10}$$
$$N-p[i_2] \leq S_{10}$$
$$N-p[i_3] \leq S_{10}$$
$$l < L_6 \quad \text{[Equations 16]}$$

(Condition 2-9)

If the interleaver size is N, and the position of three arbitrary points of an input signal from 0 to POS is $\forall i_1, \forall i_2, \forall i_3 \{0, \ldots, POS\}$, $i_a \neq i_b$, the following relations are satisfied for predetermined values $S_{11}$, and $L_7$.

$$N-i_1 \leq S_{11}$$
$$N-i_2 \leq S_{11}$$
$$N-i_3 \leq S_{11}$$
$$|p[i_1]-p[i_2]| \leq p.l1+n_1$$
$$|p[i_1]-p[i_2]| \leq p.l_2+n_2$$
$$0 =< n_1 < p$$
$$0 \leq n_2 < p$$
$$l_1+l_2 < L_7 \quad \text{[Equations 17]}$$

(Condition 2-10)

If the interleaver size is N, and the position of three arbitrary points of an input signal from 0 to POS is $\forall i_1, \forall i_2, \forall i_3 \{0, \ldots, POS\}$, $i_a \neq i_b$ the following relations are satisfied for predetermined values $S_{12}$ and $L_8$.

$$|i_1-i_2|=p.l_1+n_1$$
$$|i_2-i_3|=p.l_2+n_2$$
$$N-p[i_1] \leq S_{12}$$
$$N-p[i_2] \leq S_{12}$$
$$N-p[i_3] \leq S_{12}$$
$$0 =< n_1 < p$$
$$0 \leq n_2 < p$$
$$l_1+l_2 < L_8 \quad \text{[Equations 18]}$$

(Condition 2-11)

If the interleaver size is N, and the position of three arbitrary points of an input signal from 0 to POS is $\forall i_1, \forall i_2, \forall i_3 \{0, \ldots, POS\}$, $i_a \neq i_b$, the following relations are satisfied for predetermined values $S_{13}$ and $L_9$.

$$|i_1-i_2|=p.l_1$$
$$N-i_3 \leq S_{13}$$
$$|p[i_1]-p[i_3]|=p.l_2$$
$$N-p[i_2] \leq S_{13}$$
$$l_1+l_2 < L_9 \quad \text{[Equations 19]}$$

(Condition 2-12)

If the interleaver size is N, and the position of three arbitrary points of an input signal from 0 to POS is $\forall i_1, \forall i_2, \forall i_3 \{0, \ldots, POS\}$, $i_a \neq i_b$, the following relations are satisfied for predetermined values $S_{14}$ and $L_{10}$.

$$|i_1-i_2|=p.l_1$$
$$N-i_3 \leq S_{14}$$
$$|p[i_1]-p[i_2]| \leq p.l_2+n_1$$
$$|p[i_2]-p[i_3]| \leq p.l_3+n_2$$
$$0 =< n_1 < p$$
$$0 \leq n_2 < p$$
$$l_1+l_2+l_3 < L_{10} \quad \text{[Equations 20]}$$

(Condition 2-13)

If the interleaver size is N, and the position of three arbitrary points of an input signal from 0 to POS is $\forall i_1, \forall i_2, \forall i_3 \{0, \ldots, POS\}$, $i_a \neq i_b$, the following relations are satisfied for predetermined values $S_{15}$ and $L_{11}$.

$|i_1-i_2|=p.l_1+n_1$ $|i_2-i_3|=p.l_2+n_2$ $|p[i_1]-p[i_2]| \leq p.l_3$ $N-p[i_3] \leq S_{15}$ $0 = < n_1 < p$ $0 \leq n_2 < p$ $l_1+l_2+l_3 < L_{11}$  [Equations 21]

(Condition 2-14)

If the interleaver size is N, and the position of three arbitrary points of an input signal from 0 to POS is $\forall i_1, \forall i_2, \forall i_3 \{0, \ldots, POS\}, i_a \neq i_b$, the following relations are satisfied for predetermined values $S_{16}$ and $L_{12}$.

$|i_1-i_2|=p.l_1$ $N-i_3 \leq S_{16}$ $|p[i_1]-p[i_3]| \leq p.l_2+n_2$ $p[i_3]-p[i_2]| \leq p.l_3+n_3$ $0 = < n_1 < p$ $0 \leq n_2 < p$ $l_1+l_2+l_3 < L_{12}$  [Equations 22]

(Condition 2-15)

If the interleaver size is N, and the position of three arbitrary points of an input signal from 0 to POS is $\forall i_1, \forall i_2, \forall i_3 \{0, \ldots, POS\}, i_a \neq i_b$, the following relations are satisfied for predetermined values $S_{17}$ and $L_{13}$.

$|i_1-i_2|=p.l_1+n_1$ $|i_2-i_3|=p.l_2+n_2$ $|p[i_1]-p[i_3]| \leq p.l_3$ $N-p[i_2] \leq S_{17}$ $0 = < n_1 < p$ $0 \leq n_2 \leq p$ $l_1+l_2+l_3 < L_{13}$  [Equations 23]

In the low output weighting pattern detection routine relating to this embodiment, when at least one of the eight conditions, Condition 1–Condition 8 giving rise to specific substitution patterns, or the fifteen conditions, Condition 2-1–Condition 2-15, giving rise to a low output weighting due to the effect of the termination bit, holds, the low output weighting pattern FLAG is set to 1, and when that is not the case, the low output weighting pattern FLAG is set to 0.

For example, in the turbo encoding device 60', which comprises the convolution code of period p=3 shown in FIG. 19 as a component code, Condition 1–Condition 8 detect the low weighting code word occurrence patterns shown in FIG. 4 (described hereabove).

Figure 25A:
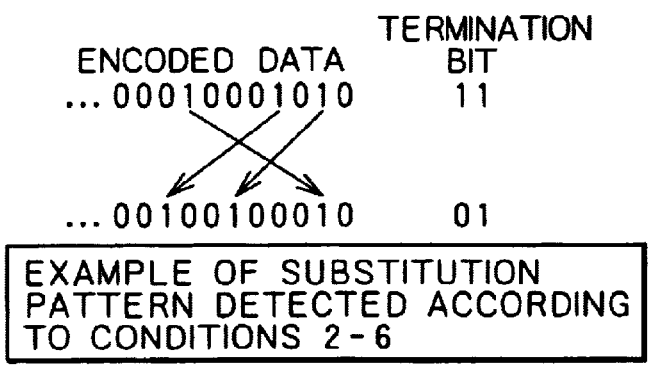
FIG. 25 is a diagram which describes substitution patterns detected according to the third embodiment of this invention.
Figure 25B:
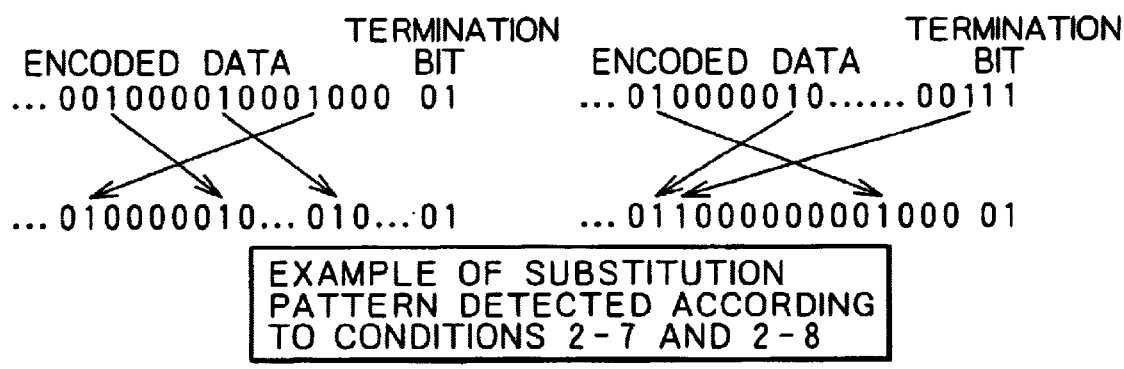
Figure 25C:
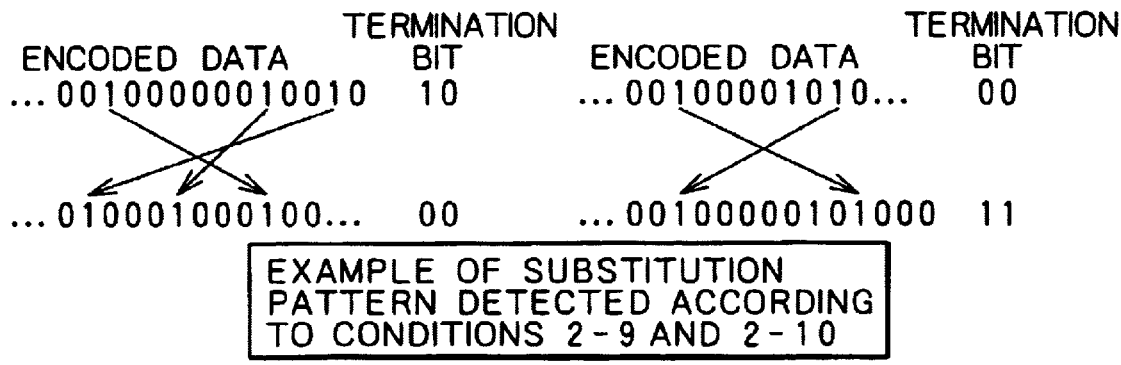
Figure 26A:
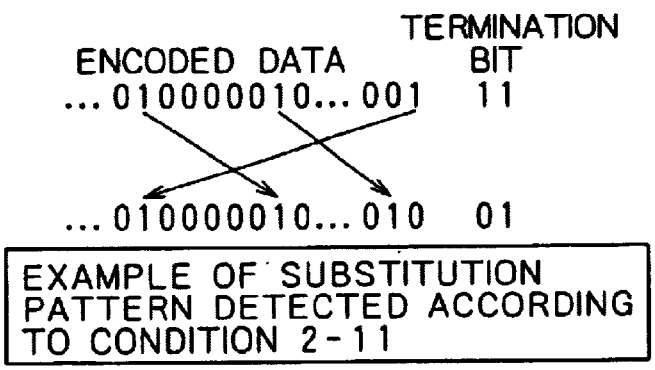
FIG. 26 is a diagram which describes substitution patterns detected according to the third embodiment of this invention.
Figure 26B:
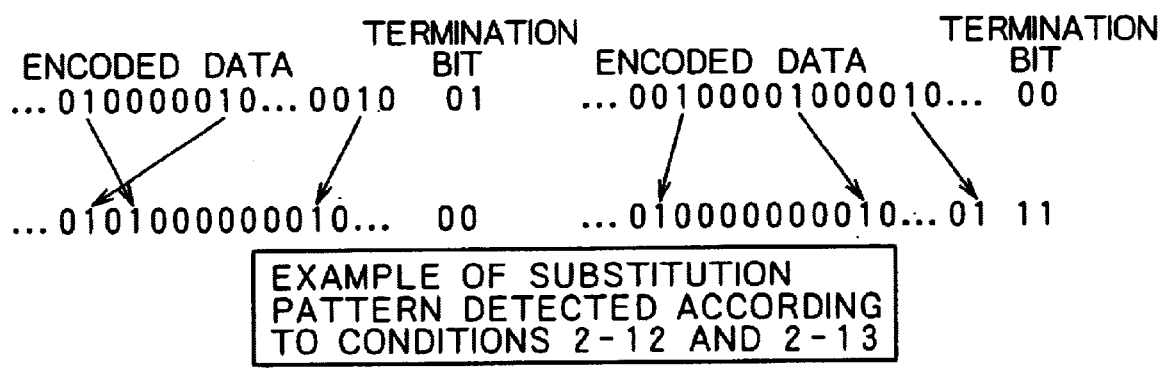
Figure 26C:
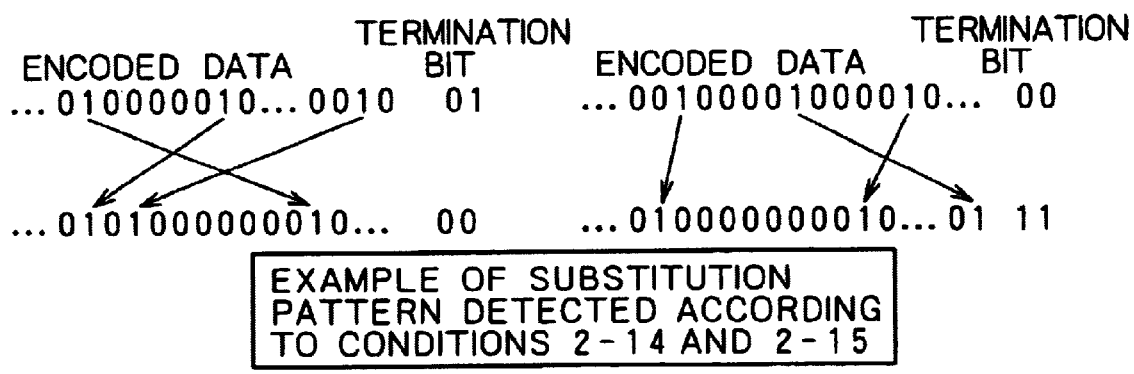

Also, Condition 2-1–Condition 2-5 detect the low weighting code word occurrence patterns shown in FIG. 23, Condition 2-6–Condition 2-10 detect the low weighting code word occurrence patterns shown in FIG. 25, and Condition 2-11–Condition 2-15 detect the low weighting code word occurrence patterns shown in FIG. 26. The arrows in each figure show the positions at which "1" was replaced in the input bits. In FIG. 26B, whereas the case is detected where a point near the end is substituted by the end of a pattern, in FIG. 26C, the case is detected where a point near the end is substituted by a position near the middle.

According to the third embodiment, a total of 23 conditions for detecting specific substitution patterns are verified, but an interleaver can be constructed wherein other conditions are added to detect specific low weighting output patterns, and further enhance coding performance.

In the low output weighting pattern detection routine, whether or not more than one of the conditions, Condition 1–Condition 8, Condition 2-1–Condition 2-15, should be applied, is determined by a balance between the enhancement of error correction performance and the processing load. That is, in order to increase the minimum distance of a code as much as possible, a larger number of conditions should be determined to eliminate substitution of fatal patterns, but this leads to an increase of processing load.

Figure 24:
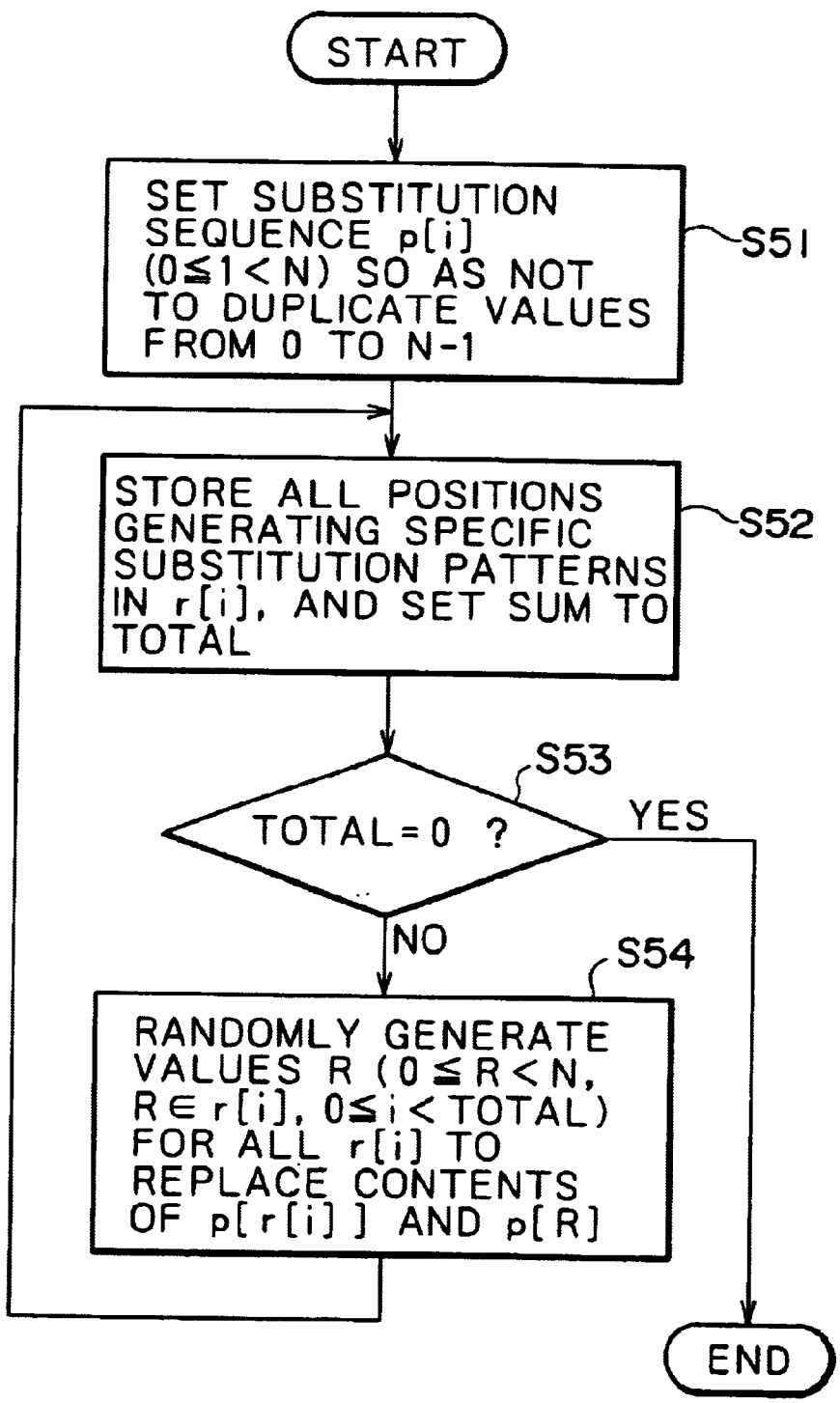
FIG. 24 is a flowchart showing another example of an algorithm for generating substitution position data relating to the third embodiment of this invention.

Another example of an algorithm for generating substitution position data which should be stored in the substitution data ROM 34 are shown in FIG. 24 in the form of a flowchart. In other words, this algorithm is a scheme for rearranging positions into which positions that generate low output weighting patterns are substituted, based on randomly generated positions. Hereafter, the various steps of the flowchart will be described.

First, in a step S51, the sequence p[i] ($0 \leq i < N$) is set so that there is no duplication in the values from 0 to (N−1).

Next, in a step S52, all the data positions in the sequence [i] which generate low output code word weighting substitution patterns are collected, the values of these positions are stored in the sequence r[i], and the sum of the positions is set as the value of the variable TOTAL. That is, values of the data positions $i_1, i_2, i_3, i_4$ which satisfy at least one of the aforementioned Condition 1–Condition 8, and Condition 2-1–Condition 2-15, are stored in r[i], and the sum is set as TOTAL.

Similarly to the low output weighting pattern detection routine shown in the flowchart of FIG. 22, in order to increase the minimum distance of a code, substitutions which generate fatal patterns must be removed as far as possible. Therefore, even if only one of these twenty-three conditions is satisfied, the values of $i_1, i_2, i_3, i_4$ at that time are stored in the sequence r[i], and the sum is set as TOTAL. If any of the values $i_1, i_2, i_3, i_4$ are already stored in the sequence r[i], that value is not stored in r[i].

Next, in a step S53, it is determined whether or not a substitution pattern having a low output weighting was generated by determining whether or not TOTAL is zero.

When a low output weighting substitution pattern was generated, the routine proceeds to the next step S54, positions which do not generate a low output weighting substitution pattern, i.e., values j which are not contained in r[i], ($0 \leq j < N$), are randomly selected, and processing wherein p[r[i]] are replaced by p[j] is performed for all r[i]. Subsequently, the routine returns to the step S52, and processing which detects low output weighting substitution patterns is repeated.

On the other hand, when a low output weighting substitution pattern was not generated, the routine proceeds to the YES branch of the determining block S54, and this whole processing routine is terminated.

There are plural low output weighting substitution patterns which give a small output code word weighting. According to the third embodiment, interleaver substitution positions were constructed to remove all such patterns without leaving any such patterns. As a result, the minimum distance of the code is increased, and a turbo encoding device and turbo decoding device having high error correction performance can be provided.
[Supplement]

This invention has been described in detail referring to specific embodiments. However, it will be understood that various modifications and substitutions may be made by those skilled in the art without departing from the spirit of the invention.

For example, in this specification, the providing medium which provides a computer program to perform the aforesaid processing may be an information recording medium such as a magnetic disk or CD-ROM, or a transmission medium via Internet or a digital satellite network.

In short, this invention has been described by way of specific examples, but these examples should not be construed as being limiting in any way. For a definition of the essential features of this invention, reference should be made to the claims appended at the beginning of this specification.

As described hereabove, according to the encoding device defined in claim 1, interleaving and encoding of input data are performed by removing substitution patterns which give a small output code word weighting, and a turbo encoding device and decoding device which offer a higher error correction performance can therefore be constructed.

According to the encoding device defined in claims 12 to 26, in addition to specific interleaving patterns which make code word weighting small, interleaving patterns which give a small output code word weighting due to the effect of the termination bit added to encoded data are also removed, and encoded data can therefore be output with still higher error correction performance.

According to the encoding method defined in claim 29 and the providing medium defined in claim 31, input data is interleaved using an interleaving pattern from which predetermined patterns giving a small code word weighting have been removed, so encoded data can be output with a high error correction performance.

According to the decoding device defined in claim 33, the decoding method defined in claim 35 and the providing medium defined in claim 37, processing which is the reverse of the interleave processing performed by the encoding device is performed, so interleaving patterns giving a small code word weighting are removed, and output encoded data can be decoded by the decoding device with a high error correction performance.

According to the method for generating data substitution information defined in claim 39 and the providing medium defined in claim 40, interleaving patterns can be generated from which substitution patterns giving a small output code word weighting and substitution patterns giving a small output code word weighting due to the effect of the termination bit added to encoded data, have been removed. By constructing a turbo encoding device which mixes up input data using interleaving patterns generated in this way, the minimum weighting of code words can be increased as far as possible, and a turbo encoding device and turbo decoding device can provide higher error correction performance.

What is claimed is:

1. An encoding device comprising convolution means for performing convolution encoding on input data, and interleaving means for performing sequential interleaving on said input data, wherein said interleaving means interleaves said input data using an interleaving pattern, said interleaving means including means for detecting a predetermined pattern in said interleaving pattern; and means for removing said predetermined pattern from said interleaving pattern before said interleaving pattern is used.

2. An encoding device as claimed in claim 1, wherein the predetermined pattern that is removed is a pattern giving a small code word weighting.

3. An encoding device as claimed in claim 1, wherein, when the period of a convolution code of said convolution means is p, positions of two arbitrary points of said input data from 0 to POS are $i_1$, $i_2$ $\{0, \ldots, POS\}$, $i_1 \neq i_2$ and positions substituted by said interleaving means are $p[i_1]$, $p[i_2]$, said interleaving means removes an interleaving pattern satisfying a first set of relations $|i_1-i_2|=pxl_1$, $|p[i_1]-p[i_2]|=pxl_2$, $l_1<L_1$, $l_2<L_1$, relative to a predetermined value $L_1$.

4. An encoding device as claimed in claim 1, wherein, when the period of a convolution code of said convolution means is p, positions of two arbitrary points of said input data from 0 to POS are $i_1$, $i_2$ $\{0, \ldots, POS\}$, $i_1 \neq i_2$ and positions substituted by said interleaving means are $p[i_1]$, $p[i_2]$, said interleaving means removes an interleaving pattern satisfying a second set of relations $|i_1-i_2|=pxl_1$, $|p[i_1]-p[i_2]|=pxl_2$, $l_1+l_2<L_2$, relative to a predetermined value $L_2$.

5. An encoding device as claimed in claim 1, wherein, when positions of two arbitrary points of said input data from 0 to POS are $i_1$, $i_2$ $\{0, \ldots, POS\}$, $i_1 \neq i_2$ and positions substituted by said interleaving means are $p[i_1]$, $p[i_2]$, said interleaving means removes an interleaving pattern satisfying a third set of relations $|i_1-i_2| \leq S_1$, $|p[i_1]-p[i_2]| \leq S_1$, relative to a predetermined value $S_1$.

6. An encoding device as claimed in claim 1, wherein, when positions of two arbitrary points of said input data from 0 to POS are $i_1$, $i_2$ $\{0, \ldots, POS\}$, $i_1 \neq i_2$ and positions substituted by said interleaving means are $p[i_1]$, $p[i_2]$, said interleaving means removes an interleaving pattern satisfying a fourth relation $|i_1-i_2|+|p[i_1]-p[i_2]| \leq S_2$, relative to a predetermined value $S_2$.

7. An encoding device as claimed in claim 1, wherein, when the period of a convolution code of said convolution means is p, positions of four arbitrary points of said input data from 0 to POS are $_1$, $i_2$, $i_3$, $i_4$ $\{0, \ldots, POS\}$, $i_a \neq i_b$ ($a \neq b$) and positions substituted by said interleaving means are $p[i_1]$, $p[i_2]$, $p[i_3]$, $[i_4]$, said interleaving means removes an interleaving pattern satisfying a fifth set of relations $|i_1-i_2|=pxm_1$, $|i_3-i_4|=pxm_2$, $|p[i_1]-p[i_3]|=pxm_3$, $|p[i_2]-p[i_4]|=pxm_4$, $(m_1, m_2, m_3, m_4) \leq M_1$, relative to a predetermined value $M_1$.

8. An encoding device as claimed in claim 1, wherein, when the period of a convolution code of said convolution means is p, positions of four arbitrary points of said input data from 0 to POS are $i_1$, $i_2$, $i_3$, $i_4$ $\{0, \ldots, POS\}$, $i_a \neq i_b$ ($a \neq b$) and positions substituted by said interleaving means are $p[i_1]$, $p[i_2]$, $p[i_3]$, $[i_4]$, said interleaving means removes an interleaving pattern satisfying a sixth set of relations $|i_1-i_2|=pxm_1$, $|i_3-i_4|=pxm_2$, $|p[i_1]-p[i_3]|=pxm_3$, $|p[i_2]-p[i_4]|=pxm_4$, $(m_1, m_2, m_3, m_4) \leq M_2$, relative to a predetermined value $M_2$.

9. An encoding device as claimed in claim 1, wherein, when positions of four arbitrary points of said input data from 0 to POS are i1, i2, i3, i4 $\{0, \ldots, POS\}$, $i_a \neq i_b$ ($a \neq b$) and positions substituted by said interleaving means are $p[i_1]$, $p[i_2]$, $p[i_3]$, $[i_4]$, said interleaving means removes an interleaving pattern satisfying a seventh set of relations $|i_1-i_2| \leq O_1$, $|i_3-i_4| \leq O_1$, $|p[i_1]-p[i_3]| \leq O1$, $|p[i_2]-p[i_4]| \leq O_1$, relative to a predetermined value $O_1$.

10. An encoding device as claimed in claim 1, wherein, when positions of four arbitrary points of said input data from 0 to POS are $i_1$, $i_2$, $i_3$, $i_4$ $\{0, \ldots, POS\}$, $i_a \neq i_b$ ($a \neq b$) and positions substituted by said interleaving means are $p[i_1]$, $p[i_2]$, $p[i_3]$, $[i_4]$, said (interleaving means removes an interleaving pattern satisfying an eighth relation $|i_1-i_2|+|i_3-i_4|+|p[i_1]-p[i_3]|+|p[i_2]-p[i_4]| \leq -O_2$, relative to a predetermined value $O_2$.

11. An encoding device as claimed in claim 1, wherein said interleaving means removes a pattern giving a small code word weighting due to the effect of a termination bit added to the end of an interleave.

12. An encoding device as claimed in claim 1, wherein, when a position of an arbitrary point from of said input data from 0 to POS is i $\{0, \ldots, \text{POS}\}$, a position substituted by said interleaving means is p[i] and the data number of said interleaving means is N, said interleaving means removes a substitution pattern in the vicinity of an end of an interleave satisfying a ninth set of relations $N-i \leq S_3$, $N-p[i] \leq S_3$ relative to a predetermined value $S_3$.

13. An encoding device as claimed in claim 1, wherein, when a position of an arbitrary point of said input data from 0 to POS is i $\{0, \ldots, \text{POS}\}$, a position substituted by said interleaving means is p[i] and the data number of said interleaving means is N, said interleaving means removes a substitution pattern in the vicinity of an end of an interleave satisfying a tenth relation $(N-i)+(N-p[i]) \leq S_4$ relative to a predetermined value $S_4$.

14. An encoding device as claimed in claim 1, wherein, when positions of two arbitrary points of said input data from 0 to POS are $i_1$, $i_2$ $\{0, \ldots, \text{POS}\}$, $i_a \neq i_b$ (a≠b), positions substituted by said interleaving means are $p[i_1]$, $p[i_2]$ and the data number of said interleaving means is N, said interleaving means removes a substitution pattern in the vicinity of an end of an interleave satisfying an eleventh set of relations $N-i_1 \leq S_5$, $N-i_2 \leq S_5$, $N-p[i_1] \leq S_5$, $N-p[i_2] \leq S_5$, relative to a predetermined value $S_5$.

15. An encoding device as claimed in claim 1, wherein, when the period of a convolution code of said convolution means is p, positions of two arbitrary points of said input data from 0 to POS are $i_1$, $i_2$ $\{0, \ldots, \text{POS}\}$, $i_a \neq i_b$ (a≠b)), positions substituted by said interleaving means are $p[i_1]$, $P[i_2]$ and the data number of said interleaving means is N, said interleaving means removes a substitution pattern in the vicinity of an end of an interleave satisfying a twelfth set of relations $N-i_1 \leq S_6$, $N-i_2 \leq S_6$, $|pi_1]-[pi_2]| \leq p.l$, $l<L_3$, relative to predetermined values $S_6$ and $L_3$.

16. An encoding device as claimed in claim 1, wherein, when the period of a convolution code of said convolution means is p, positions of two arbitrary points of said input data from 0 to POS are $i_1$, $i_2$ $\{0, \ldots, \text{POS}\}$, $i_a \neq i_b$ (a≠b), positions substituted by said interleaving means are $p[i_1]$, $p[i_2]$ and the data number of said interleaving means is N, said interleaving means removes a substitution pattern in the vicinity of an end of an interleave satisfying a thirteenth set of relations $|i_1-i_2| \leq p.l$, $N-p[i_1] \leq S_7$, $N-p[i_2] \leq S_7$, $l<L_4$, relative to predetermined values $S_7$ and $L_4$.

17. An encoding device as claimed in claim 1, wherein, when positions of three arbitrary points of said input data from 0 to POS are $i_1$, $i_2$, $i_3$ $\{0, \ldots, \text{POS}\}$, $i_a \neq i_b$ (a≠b), positions substituted by said interleaving means are $p[i_1]$, $p[i_2]$, $p[i_3]$ and the data number of said interleaving means is N, said interleaving means removes a substitution pattern in the vicinity of an end of an interleave satisfying a fourteenth set of relations $N-i_1 \leq S_8$, $N-i_2 \leq S_8$, $N-i_3 \leq S_8$, $N-p[i_1] \leq S_8$, $N-p[i_2] \leq S_8$, $N-p[i_3] \leq S_8$, relative to a predetermined value $S_8$.

18. An encoding device as claimed in claim 1, wherein, when the period of a convolution code of said convolution means is p, positions of three arbitrary points of said input data from 0 to POS are $i_1$, $i_2$, $i_3$ $\{0, \ldots, \text{POS}\}$, $i_a \neq i_b$ (a≠b), positions substituted by said interleaving means are $p[i_1]$, $p[i_2]$, $p[i_3]$ and the data number of said interleaving means is N, said interleaving means removes a substitution pattern in the vicinity of an end of an interleave satisfying a fifteenth set of relations $N-i_1 \leq S_9$, $N-i_2 \leq S_9$, $N-i_3 \leq S_9$, $|p[i_1]-p[i_2]| \leq p.l$, $N-p[i_3] \leq S_1$, $l<L_5$, relative to predetermined values $S_9$ and $L_5$.

19. An encoding device as claimed in claim 1, wherein, when the period of a convolution code of said convolution means is p, positions of three arbitrary points of said input data from 0 to POS are $i_1$, $i_2$, $i_3$ $\{0, \ldots, \text{POS}\}$, $i_a \neq i_b$ (a≠b), positions substituted by said interleaving means are $p[i_1]$, $p[i_2]$, $p[i_3]$ and the data number of said interleaving means is N, said interleaving means removes a substitution pattern in the vicinity of an end of an interleave satisfying a sixteenth set of relations $|i_1-i_2| \leq p.l$, $N-i_3 \leq S_{10}$, $N-p[i_1] \leq S_{10}$, $N-p[i_2] \leq S_{10}$, $N-p[i_3] \leq S_{10}$, $l<L_6$, relative to predetermined values $S_{10}$ and $L_6$.

20. An encoding device as claimed in claim 1, wherein, when the period of a convolution code of said convolution means is p, positions of three arbitrary points of said input data from 0 to POS are $i_1$, $i_2$, $i_3$ $\{0, \ldots, \text{POS}\}$, $i_a \neq i_b$ (a≠b), positions substituted by said interleaving means are $p[i_1]$, $p[i_2]$, $p[i_3]$ and the data number of said interleaving means is N, said interleaving means removes a substitution pattern in the vicinity of an end of an interleave satisfying a seventeenth set of relations $N-i_1 \leq S_{11}$, $N-i_2 \leq S_{11}$, $N-i_3 \leq S_{11}$, $|p[i_1]-p[i_2]|=p.l_1+n_1$, $|p[i_2]-p[i_3]|=p.l_2+n_2$, $0 \leq n_1 < p$, $0 \leq n_2 < p$, $l_1+l_2 < L_7$, relative to predetermined values $S_{11}$ and $L_7$.

21. An encoding device as claimed in claim 1, wherein, when the period of a convolution code of said convolution means is p, positions of three arbitrary points of said input data from 0 to POS are $i_1$, $i_2$, $i_3$ $\{0, \ldots, \text{POS}\}$, $i_a \neq i_b$ (a≠b), positions substituted by said interleaving means are $p[i_1]$, $p[i_2]$, $p[i_3]$ and the data number of said interleaving means is N, said interleaving means removes a substitution pattern in the vicinity of an end of an interleave satisfying an eighteenth set of relations $|i_1-i_2|=p.l_1+n_1$, $|i_2-i_3|=p.l_2+n_2$, $N-p[i_1] \leq S_{12}$, $N-p[i_2] \leq S_{12}$, $N-p[i_3] \leq S_{12}$, $0 \leq n_1 < p$, $0 \leq n_2 < p$, $l_1+l_2 < L_8$, relative to predetermined values $S_{12}$ and $L_8$.

22. An encoding device as claimed in claim 1, wherein, when the period of a convolution code of said convolution means is p, positions of three arbitrary points of said input data from 0 to POS are $i_1$, $i_2$, $i_3$ $\{0, \ldots, \text{POS}\}$, $i_a \neq i_b$ (a≠b), positions substituted by said interleaving means are $p[i_1]$, $p[i_2]$, $p[i_3]$ and the data number of said interleaving means is N, said interleaving means removes a substitution pattern in the vicinity of an end of an interleave satisfying a nineteenth set of relations $|[i_1]-[i_2]|=p.l_1$, $N-i_3 \leq S_{13}$, $|p[i_1]-p[i_3]|=p.l_2$, $N-p[i_2] \leq S13$, $l_1+l_2 < L_9$, relative to predetermined values $S_{13}$ and $L_9$.

23. An encoding device as claimed in claim 1, wherein, when the period of a convolution code of said convolution means is p, positions of three arbitrary points of said input data from 0 to POS are $i_1$, $i_2$, $i_3$ $\{0, \ldots, \text{POS}\}$, $i_a \neq i_b$ (a≠b), positions substituted by said interleaving means are $p[i_1]$, $p[i_2]$, $p[i_3]$ and the data number of said interleaving means is N, said interleaving means removes a substitution pattern in the vicinity of an end of an interleave satisfying a twentieth set of relations $|[i_1]-[i_2]|=p.11$, $N-i_3 \leq S_{14}$, $|p[i_1]-p[i_2]|=p.l_2+n11$, $|p[i_2]-p[i_3]|=p.l_3+n_2$, $0 \leq n_1 < p$, $0 \leq n_2 < p$, $l_1+l_2+l_3 < L_{10}$, relative to predetermined values $S_{14}$ and $L_{10}$.

24. An encoding device as claimed in claim 1, wherein, when the period of a convolution code of said convolution means is p, positions of three arbitrary points of said input data from 0 to POS are $i_1$, $i_2$, $i_3$ $\{0, \ldots, \text{POS})\}$, $i_a \neq i_b$ (a≠b), positions substituted by said interleaving means are $p[i_1]$, p[i_2]$, $p[i_3]$ and the data number of said interleaving means is N, said interleaving means removes a substitution pattern in the vicinity of an end of an interleave satisfying a twenty-first set of relations $|[i_1]-[i_2]|=p.l_1+n_1$, $[i_2]-[i_3]|= p.l_2+n_2$, $|p[i_1]-p[i_2]|=p.l_3$, $N-p[i_3] \leq S_{15}$, $0 \leq n_1 < p$, $0 \leq n_2 l_1 + l_2 + l_3 < L_{11}$, relative to predetermined values $S_{15}$ and $L_{11}$.

25. An encoding device as claimed in claim 1, wherein, when the period of a convolution code of said convolution means is p, positions of three arbitrary points of said input data from 0 to POS are $i_1, i_2, i_3 \{0, \ldots, POS\}$, $i_a \neq i_b$ ($a \neq b$), positions substituted by said interleaving means are $p[i_1]$, $p[i_2]$, $p[i_3]$ and the data number of said interleaving means is N, said interleaving means removes a substitution pattern in the vicinity of an end of an interleave satisfying a twenty-second set of relations $|[i_1]-[i_2]|=p.l_1$, $N-i_3 \leq S_{16}$, $|p[i_1]-p[i_2]|=p.l_2+n_1$, $|p[i_3]-p[i_2]|=p.l_3+n_2$, $0 \leq n_1 < p$, $0 \leq n_2 < p$, $l_1+l_2+l_3 < L_{12}$, relative to predetermined values $S_{16}$ and $L_{12}$.

26. An encoding device as claimed in claim 1, wherein, when the period of a convolution code of said convolution means is p, positions of three arbitrary points of said input data from 0 to POS are $i_1, i_2, i_3 \{0, \ldots, POS\}$, $i_a \neq i_b$ ($a \neq b$), positions substituted by said interleaving means are $p[i_1]$, $p[i_2]$, $p[i_3]$ and the data number of said interleaving means is N, said interleaving means removes a substitution pattern in the vicinity of an end of an interleave satisfying a twenty-third set of relations $|[i_1]-[i_2]|=p.l_1+n_1$, $|[i_2]-[i_3]|= p.l_2+n_2$, $|p[i_1]-p[i_3]|=p.3$, $N-p[i_2] \leq S_{17}$, $0 \leq n_1 < p$, $0 \leq n_2 < p$, $l_1+l_2+l_3 < Ll_3$, relative to predetermined values $S_{17}$ and $L_{13}$.

27. An encoding device as claimed in claim 1, wherein said interleave means removes a substitution pattern in the vicinity of the end of an interleave for which at least one of said ninth to twenty-third sets of relations of claims 12 to 26 holds.

28. An encoding device as claimed in claim 1, wherein said interleave means removes an interleaving pattern for which at least one of said first to twenty-third relations or sets of relations of claims 3 to 10 and claims 12 to 26 holds.

29. An encoding method for an encoding device comprising convolution means for performing convolution encoding of input data and interleaving means for performing sequential interleaving on said input data, wherein:

said interleaving means interleaves said input data using an interleaving pattern, a predetermined pattern in said interleaving pattern giving a small code word weighting is detected, and said predetermined pattern is removed from said interleaving pattern before said interleaving pattern is used.

30. A decoding device for decoding encoded data output by an encoding device comprising convolution means for performing convolution encoding on input data, and interleaving means for interleaving said input data using an interleaving pattern, said interleaving means including means for detecting in said interleaving pattern a predetermined pattern giving a small code word weighting, and means for removing said predetermined pattern from said interleaving pattern before said interleaving pattern is used, wherein:

said decoding means comprises interleaving means for performing the reverse processing to the interleaving processing performed by said encoding device.

31. A decoding method for a decoding device which decodes encoded data output by an encoding device comprising convolution means for performing convolution encoding on input data, and interleaving means for interleaving said input data using an interleaving pattern, said interleaving means including means for detecting in said interleaving pattern a predetermined pattern giving a small code word weighting, and means for removing said predetermined pattern from said interleaving pattern before said interleaving pattern is used, wherein:

said decoding method comprises an interleaving step for performing the reverse processing to the interleaving processing performed by said encoding device.

32. A providing medium for providing a program which is readable by a computer for making a decoding device, which decodes encoded data output by an encoding device comprising convolution means for performing convolution encoding on input data and interleaving means for performing sequential interleaving on said input data using an interleaving pattern, said interleaving means including means for detecting in said interleaving pattern a predetermined pattern and means for removing said predetermined pattern from said interleaving pattern before said interleaving pattern is used, and carrying out processing comprising an interleaving step for performing the reverse processing to the interleaving processing performed by said encoding device.

* * * * *